(12) United States Patent
Kamata

(10) Patent No.: US 8,593,858 B2
(45) Date of Patent: Nov. 26, 2013

(54) DRIVING METHOD OF SEMICONDUCTOR DEVICE

(75) Inventor: Koichiro Kamata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 196 days.

(21) Appl. No.: 13/218,899

(22) Filed: Aug. 26, 2011

(65) Prior Publication Data

US 2012/0051120 A1 Mar. 1, 2012

(30) Foreign Application Priority Data

Aug. 31, 2010 (JP) ................................ 2010-194501

(51) Int. Cl.
*G11C 11/24* (2006.01)

(52) U.S. Cl.
USPC ............................ 365/149; 365/231; 365/104

(58) Field of Classification Search
USPC ......................................... 365/149, 231, 104
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |
| 6,292,392 B1 | 9/2001 | Fukui |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1 767 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Son Dinh
*Assistant Examiner* — Nam Nguyen
(74) *Attorney, Agent, or Firm* — Fish & Richardson P.C.

(57) ABSTRACT

A driving method by which stored data can be retained even with no power supply and the number of writing operations is not limited is provided. The variation of a writing potential to a memory element is suppressed to improve the reliability according to a new driving method. According to the driving method of a semiconductor device, in writing data, the writing potential is increased step-by-step while verifying the reading current, and the result of the reading current is used for the writing current. That is, data writing is performed while verifying whether data writing is performed with an accurate potential. Accordingly, data writing can be performed with high reliability.

16 Claims, 16 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,352,604 B2 * | 4/2008 | Shionoiri et al. | 365/94 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2011/0147737 A1 | 6/2011 | Yamazaki et al. | |
| 2011/0156028 A1 | 6/2011 | Yamazaki et al. | |
| 2011/0157961 A1 | 6/2011 | Yamazaki et al. | |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-025682 A | 1/1999 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-

(56) References Cited

OTHER PUBLICATIONS

OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09: Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GiZo (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of IgZo Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S et al., "First Principles Meth9ods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Clesteric Liquid Crystal and its Blue Phase," Phy. Rev. A (Physical Review A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda, T et al., "Full-Functional System Liquid Crystal Display Using Cg-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Sys-

(56) References Cited

OTHER PUBLICATIONS tems [A; Fe, Ga, or Al; B: Mg, Mn, Fe, Ni, Cu, or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IgZo Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al "Modulated Structures of Homologous Compounds InMO3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(Zno)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09: SID International Symposium Digest of Technical Papers, May 31, 2009, pp. 284-287.

\* cited by examiner

DRIVING METHOD OF SEMICONDUCTOR DEVICE

BACKGROUND OF THE INVENTION

1. Field of the Invention

The present invention relates to a driving method of a semiconductor device using a semiconductor element.

2. Description of the Related Art

Storage devices using semiconductor elements are roughly classified into two categories: a volatile device that loses stored data when power supply stops, and a non-volatile device that retains stored data even without being supplied with power.

A typical example of a volatile storage device is a DRAM (dynamic random access memory). A DRAM stores data in such a manner that a transistor included in a memory element is selected and electric charge is stored in a capacitor.

According to the above-described principle, once data is read from a DRAM, electric charge in the capacitor is lost; thus, a writing operation needs to be performed every time data is read out. Moreover, the transistor in the memory element has a leakage current (off-state current) between a source and a drain in an off state, and therefore, electric charge flows into or out of a capacitor even when the transistor is not selected, whereby a data retaining period is short. For that reason, a writing operation (refresh operation) needs to be performed at certain intervals, which makes it difficult to sufficiently reduce power consumption. Further, since stored data is lost when power supply stops, another kind of storage device using a magnetic material or an optical material is needed in order to retain stored data for a long time.

Another example of a volatile storage device is an SRAM (static random access memory). An SRAM retains stored data by using a circuit such as a flip-flop and thus does not need a refresh operation, which is an advantage of the SRAM over the DRAM. However, cost per storage capacity is increased because the circuit such as a flip-flop is used. In addition, as in the DRAM, stored data in the SRAM is lost when power supply stops.

A typical example of a non-volatile storage device is a flash memory. A flash memory includes a floating gate between a gate electrode and a channel formation region in a transistor and stores data by retaining electric charge in the floating gate. Therefore, a flash memory has advantages in that the data retaining period is extremely long (almost permanent) and a refresh operation, which is necessary in a volatile storage device, is not needed (e.g., see Patent Document 1).

However, a gate insulating layer included in a memory element deteriorates by tunneling current generated in writing data, a number of writing operations deteriorate the function of the memory element. In order to reduce adverse effects of this problem, a method in which the number of writing operations for each memory element is equalized is employed, for example; however, a complicated peripheral circuit is involved to carry out this method. Further, such a method does not solve the fundamental problem of lifetime. That is, a flash memory is not suitable for applications in which data is frequently rewritten.

As for the flash memory, a "multi-valued" flash memory in which data whose number of levels is greater than 2 is stored in one memory cell has been proposed for higher memory capacity (e.g., see Patent Document 2).

Reference

Patent Document 1: Japanese Published Patent Application No. S57-105889

Patent Document 2: Japanese Published Patent Application No. H11-025682

SUMMARY OF THE INVENTION

However, a multi-valued memory requires many different potentials in accordance with the increase in the memory capacity, which involves a larger number of circuits, leading to increase in size or cost of a semiconductor device.

Further, a circuit in the multi-valued memory is generally a circuit including a plurality of transistors; thus, variation of characteristics of the transistors makes the value of the same potential vary per memory cell. In some cases, such a variation prevents accurate data writing and/or accurate data reading.

In view of the above, an object of one embodiment of the present invention is to provide a driving method by which stored data can be retained even with no power supply and the number of writing operations is not limited. An object of one embodiment of the present invention is to suppress variation of a writing potential to a memory element to improve the reliability according to a new driving method.

According to one embodiment of the present invention, in writing data into a memory cell using a transistor including an oxide semiconductor layer, the writing potential is increased step-by-step while verifying the reading current, and the result of the reading current is used for the writing current. That is, data writing is performed while verifying whether data writing is performed with an accurate potential.

The transistor used in the memory cell includes a semiconductor layer formed using a material which enables the off-state current to be sufficiently reduced, such as a wide-gap material (more specifically, for example, a semiconductor material whose energy gap Eg is greater than 3 eV). Since an oxide semiconductor material is a wide-gap semiconductor, a semiconductor device including a transistor including an oxide semiconductor layer using the oxide semiconductor material is formed. With such a semiconductor material which allows a sufficient reduction in the off-state current of a transistor, data can be retained for a long time.

According to one embodiment of a driving method of a semiconductor device of the present invention, the semiconductor device includes a first transistor including a first gate terminal electrically connected to a word line, a first source terminal electrically connected to a bit line, a first drain terminal electrically connected to a source line, and a substrate containing a semiconductor material; a second transistor including a second gate terminal electrically connected to a word line for an oxide semiconductor, a second source terminal electrically connected to a bit line for an oxide semiconductor, a second drain terminal electrically connected to the first gate terminal of the first transistor, and an semiconductor layer; and a capacitor electrically connected to the first gate terminal of the first transistor and the word line. A memory element includes the first transistor, the second transistor, and the capacitor. According to the driving method, data is written into the memory element in the following manner: a potential is supplied to the word line for an oxide semiconductor to turn on the second transistor, a potential is supplied to the bit line step-by-step to supply electrical charge to the first gate terminal of the first transistor, while reading current which flows into the first transistor, and the step-by-step potential supply to the bit line is stopped when the current which flows into the first transistor reaches a given potential.

In the above-described structure, the memory elements (also called memory cells) may be arranged in m rows (in the horizontal direction) by n columns (in the longitudinal direction) (m and n are natural numbers greater than or equal to 1), and the data writing may be performed per row sequentially from the top.

In the above-described structure, the semiconductor material may be a single crystalline semiconductor material.

In the above-described structure, the semiconductor material may be silicon.

In the above-described structure, the oxide semiconductor layer may be an oxide semiconductor including In, Ga, and Zn.

Although the second transistor is formed using an oxide semiconductor material in the above-described structure, one embodiment of the present invention is not limited thereto. A widegap material (more specifically, a semiconductor material whose energy gap Eg is greater than 3 eV, for example), such as an oxide semiconductor material, or the like may be employed.

In this description and the like, the term "over" or "below" does not necessarily mean that one component is placed "directly on" or "directly under" the other component. For example, the structure where "a gate electrode over a gate insulating layer" does not exclude the case where any component is provided between the gate insulating layer and the gate electrode.

In addition, in this description and the like, the term "electrode" or "wiring" does not limit a function of the component. For example, the "electrode" is sometimes used as part of the "wiring", and vice versa. Furthermore, the term "electrode" or "wiring" can also mean a plurality of "electrodes" or "wirings" formed in an integrated manner.

Functions of a "source" and a "drain" may be changed with each other when the polarity of the transistor is changed or when the direction of current flowing is changed in circuit operation, for example. Therefore, the terms "source" and "drain" can be changed with each other to be used in this description and the like.

In this description and the like, the term "electrically connected" also means connection via an "object having an electric function." There is no particular limitation on the "object having an electric function" as long as electric signals can be transmitted and received between components that are connected via the object.

Examples of the "object having an electric function" are a switching element such as a transistor, a resistor, an inductor, a capacitor, and an element with a variety of functions as well as an electrode and a wiring.

Since the off-state current of a transistor using an oxide semiconductor is extremely low, stored data can be retained for an extremely long time with the transistor. In other words, power consumption can be adequately reduced because refresh operation becomes unnecessary or the frequency of refresh operation can be extremely reduced. Moreover, stored data can be retained for a long time even when power is not supplied.

Further, in a driving method of a semiconductor device according to one embodiment of the present invention, data writing does not need high voltage and there is no problem of element deterioration. For example, unlike a conventional nonvolatile memory, there is no need to perform injection of electrons to a floating gate and extraction of electrons from the floating gate, which leads to no deterioration of a gate insulating layer. That is, in the driving method of a semiconductor device according to one embodiment of the present invention, the number of times of rewritings, which is a problem in a conventional non-volatile memory, is not limited, and reliability is drastically improved. Further, data is written depending on the state of on/off of the transistor, which makes it possible to easily realize high-speed operation. In addition, there is no need of operation for erasing data.

Further, since a transistor using a material other than an oxide semiconductor can operate at sufficiently high speed, the combination of the transistor and the transistor using an oxide semiconductor enables a semiconductor device to perform operation (e.g., data reading) at sufficiently high speed. Further, with the transistor using a material other than an oxide semiconductor, a variety of circuits (such as a logic circuit or a driver circuit) which is required to operate at high speed can be realized as appropriate.

As described above, the transistor using a material other than an oxide semiconductor (more broadly, a transistor capable of operation at sufficiently high speed) and the transistor using an oxide semiconductor (more broadly, a transistor whose off-state current is sufficiently low) are provided, thereby realizing a driving method of a semiconductor device with a novel feature.

Further, according to one embodiment of the present invention, in writing data, the writing potential is increased step-by-step while verifying the reading current, and the result of the reading current is used for the writing potential. Accordingly, adverse effects of variations in characteristics of transistors in memory cells can be suppressed, so that stable writing of data can be performed.

BRIEF DESCRIPTION OF THE DRAWINGS

In the accompanying drawings:

FIGS. 7A-1, 7A-2, 7A-3, 7A-4, 7B-1, 7B-2, 7B-3, and 7B-4 are timing charts;

DETAILED DESCRIPTION OF THE INVENTION

Figure 1A:
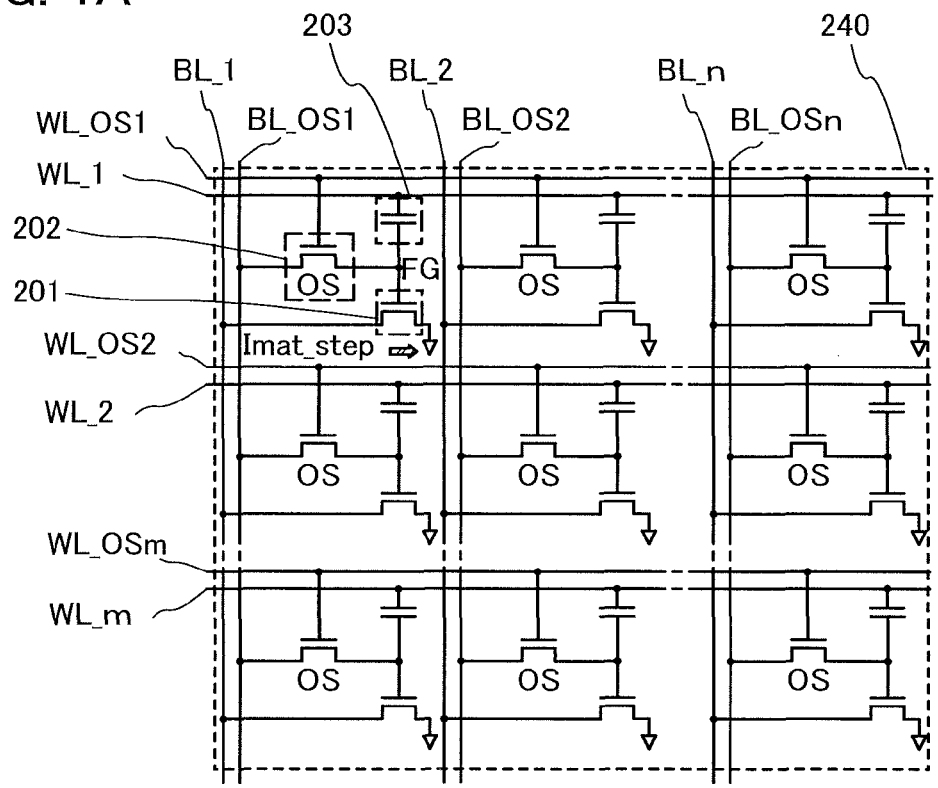
FIGS. 1A and 1B are a circuit diagram and a timing chart of a semiconductor device.

Hereinafter, embodiments of the present invention will be described with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in the drawings and the like is not accurately represented in some cases for easy understanding. Therefore, the present invention is not necessarily limited to the position, size, range, or the like as disclosed in the drawings and the like.

In addition, in this description and the like, ordinal numbers such as "first", "second", and "third" are used in order to avoid confusion among components, and the terms do not mean limitation of the number of components.

(Embodiment 1)

In this embodiment, a circuit configuration and a driving method of a semiconductor device according to one embodiment of the present invention will be described with reference to FIGS. 1A and 1B, FIG. 2, FIGS. 3A and 3B, and FIG. 4. In each of the circuit diagrams, in some cases, reference symbol "OS" is written beside a transistor in order to indicate that the transistor includes an oxide semiconductor.

<Basic Circuit>

First, a basic circuit configuration and a driving method thereof will be described with reference to FIGS. 1A and 1B. In a circuit configuration of a semiconductor device shown in FIG. 1A, one memory cell includes a first transistor 201 provided for a substrate including a semiconductor material, a second transistor 202 including an oxide semiconductor layer, and a capacitor 203. The first transistor 201 has a first gate terminal electrically connected to a first word line (WL_1), a first source terminal electrically connected to a first bit line (BL_1), and a first drain terminal electrically connected to a source line. The second transistor 202 has a second gate terminal electrically connected to a first word line for an oxide semiconductor (WL_OS1), a second source terminal electrically connected to a first bit line for an oxide semiconductor (BL_OS1), and a second drain terminal electrically connected to the first gate terminal of the first transistor 201 and a first line for an oxide semiconductor. The capacitor 203 is electrically connected between the first gate terminal of the first transistor 201 and the first word line.

A memory cell array 240 is formed by arranging the memory cells in m rows (in the horizontal direction) by n columns (in the longitudinal direction) an and n are natural numbers greater than or equal to 1).

Here, as the second transistor 202, a transistor including an oxide semiconductor is used, for example. The off-state current of the transistor including an oxide semiconductor is significantly low. Therefore, the potential of the gate electrode of the first transistor 201 can be retained for an extremely long period by turning off the second transistor 202. Further, the capacitor 203 makes it easy to retain electrical charge supplied to the gate electrode of the first transistor 201 and to read out the retained data.

There is no particular limitation on the first transistor 201. In terms of increasing the speed of reading data it is preferable to use a transistor with high switching rate such as a transistor using single crystal silicon.

<Driving Method 1>

With the circuit configuration shown in FIG. 1A, using the capability of retaining the potential of the first gate terminal of the first transistor 201, data writing, retaining, and reading can be performed as follows.

First, writing and retaining of data will be described. First, a potential is supplied to the first word line for an oxide semiconductor (WL_OS1) to turn on the second transistor 202. Consequently, the potential of the first bit line for an oxide semiconductor (BL_OS1) is supplied to the first gate terminal of the first transistor 201 and the capacitor 203. The potential of the first bit line for an oxide semiconductor (BL_OS1) is increased step-by-step, whereby the potation of a portion connected to the first gate terminal of the first transistor 201 (that is, a node FG, also referred to as a storage node, denoted by FG FIG. 1A) also increases step-by-step. As the potential of the node FG increases step-by-step, the reading current (Imat_Step) which flows into the first transistor 201 also increases step-by-step. The reading current (Imat_Step) is monitored and the potential of the first bit line for an oxide semiconductor (BL_OS1) is increased step-by-step until the reading current (Imat_Step) reaches a given potential. In this manner, a given electrical charge is supplied to the first gate terminal of the first transistor 201 (data writing is performed). Here, one of electrical charges supplying two different potentials (hereinafter, an electrical charge supplying a low potential is referred to as charge $Q_L$ and an electrical charge supplying a high potential is referred to as charge $Q_H$) is supplied thereto. Electrical charges supplying three or more different potentials may be applied to improve the storage capacity.

In data writing, since the reading current (Imat_Step) is monitored, it is preferable to supply a negative potential to the other non-selected word lines in order to avoid miswriting into the non-selected word lines. Specifically, a potential of −3 V can be used as each of the writing voltage of the non-selected word lines and the reading voltage of the non-selected word lines.

Then, at the time when the reading current (Imat_Step) reaches the given potential, the potential of the first bit line for an oxide semiconductor (BL_OS1) stops being supplied to turn off the second transistor 202, whereby the electrical charge supplied to the first gate terminal of the first transistor 201 is retained (data retaining is performed).

Next, reading of data will be described. An appropriate potential (reading potential) is supplied to the first word line (WL_1) connected to one end of the capacitor 203 while the first bit line (BL_1) is supplied with a certain potential, so that the potential of the source current or the drain current of the first transistor 201 differs depending on the amount of electrical charge retained in the first gate terminal of the first transistor 201. This is because, generally, in the case where the first transistor 201 is an n-channel transistor, an apparent threshold voltage $V_{th\_L}$ with the charge $Q_L$ supplied to the gate electrode of the first transistor 201 is higher than an apparent threshold voltage $V_{th\_H}$ with the charge $Q_H$ supplied to the gate electrode of the first transistor 201. Here, the apparent threshold voltage refers to the potential of the first word line (WL_1), which is needed to turn on the first transistor 201. Thus, the potential of the first word line (WL_1) is set to a potential $V_0$ intermediate between $V_{th\_H}$ and $V_{th\_L}$, so that the electrical charge supplied to the gate electrode of the first transistor 201 can be judged. For example, in the case where charge $Q_H$ is supplied by data writing, the first transistor 201 is turned on by supplying $V_0$ (>$V_{th\_H}$), the potential of the first word line (WL_1). In the case where $Q_L$ is supplied, the first transistor 201 is kept off even by supplying $V_0$ (<$V_{th\_L}$), the potential of the first word line (WL_1). Accordingly, the potential of the source terminal of the first transistor 201 differs in those cases; thus, through detection of the potential of the source terminal of the first transistor 201, retained data can be read out (data reading is performed).

In the case where memory cells are arrayed as described in this embodiment, it is necessary that data of part of the memory cell allay can be read out. In that case, in order to read data of certain memory cells without reading data of the other memory cells, the following may be performed: in the case where the first transistors 201 are connected in parallel, the first word lines (WL_1) of the memory cells which are not targeted for data reading are supplied with a potential by which the first transistor 201 is turned off regardless of the electrical charge retained in the gate electrode, i.e., a potential lower than $V_{th\_H}$; in the case where the first transistors 201 are connected in series, the first word lines (WL_1) of the memory cells which are not targeted for data reading are supplied with a potential by which the first transistor 201 is turned on regardless of the electrical charge retained in the gate electrode, i.e., a potential higher than $V_{th\_L}$.

Next, rewriting of data will be described. Data rewriting is performed in a manner similar to that of the above-described data writing and data retaining. That is, the potential is supplied to the first word line for an oxide semiconductor (WL_OS1) to turn on the second transistor 202. Consequently, the potential of the first bit line for an oxide semiconductor (BL_OS1) (a potential of new data) is supplied to the first gate terminal of the first transistor 201 and the capacitor 203. Like the data writing, the potential of the first bit line for an oxide semiconductor (BL_OS1) is also increased step-by-step while monitoring the reading current (Imat_Step). The potential of the first bit line for an oxide semiconductor (BL_OS1) is kept increasing step-by-step until the reading current (Imat_Step) reaches a given potential. Then, at the time when the reading current (Imat_Step) reaches the given potential, the potential of the first bit line for an oxide semiconductor (BL_OS1) stops being supplied to turn off the second transistor 202, whereby the electrical charge of the data supplied to the first gate terminal of the first transistor 201 is retained (data rewriting is performed).

In this manner, the driving method of a semiconductor device according to one embodiment of the present invention allows data to be directly rewritten by performing data writing again. Therefore, extracting of electrical charge from a floating gate with the use of a high voltage, which is needed in a flash memory or the like, is not necessary and thus, reduction in operation speed, which is attributed to data erasing operation, can be suppressed. That is, high-speed operation of the semiconductor device can be realized. Further, with the monitoring of the reading potential during data writing, the writing potential is increased step-by-step until the reading potential reaches a given potential, whereby miswriting of data can be prevented, so that the reliability for data writing is significantly improved.

Note that the drain electrode (or the source electrode) of the second transistor 202 which is electrically connected to the gate electrode of the first transistor 201 has a function similar to that of a floating gate of a floating-gate transistor used as a nonvolatile memory element. Therefore, in the drawings, a portion where the drain electrode (or the source electrode) of the second transistor 202 is electrically connected to the gate electrode of the first transistor 201 is called a floating gate portion FG in some cases. In the second transistor 202 in the off state, the floating gate portion FG can be regarded as being embedded in an insulator and electric charge is retained in the floating gate portion FG. The off-state current of the second transistor 202 using an oxide semiconductor is lower than or equal to one hundred-thousandth of that of a transistor using a silicon semiconductor or the like; thus, loss of the electrical charge accumulated in the floating gate portion FG due to leakage current of the second transistor 202 is as small as negligible. That is, with the second transistor 202 using an oxide semiconductor, a nonvolatile storage device which can retain data without being supplied with power can be realized.

For example, in the case where the off-state current of the second transistor 202 at room temperature (25° C.) is less than or equal to 10 zA (1 zA (zeptoampere)=$1\times 10^{-21}$ A) and the capacitance of the capacitor 203 is about 10 fF, data can be retained for $10^4$ seconds or longer. It is needless to say that the retention time depends on transistor characteristics and the capacitance.

Further, in that case, the problem of deterioration of a gate insulating film (tunnel insulating film), which has been pointed out in a conventional floating-gate transistor, does not occur. That is, the deterioration of a gate insulating film due to injection of an electron into a floating gate, which has been regarded as a problem, can be solved. This means that there is no limit on the number of times of data writings in principle. Furthermore, a high voltage, which has been needed for data writing or data erasing in a conventional floating-gate transistor, is not necessary.

In the driving method of the semiconductor device described in this embodiment, the floating gate portion FG has a function similar to that of the floating gate of a floating-gate transistor such as a flash memory; however, the floating gate portion FG of this embodiment has a feature which is essentially different from that of the floating gate of the flash memory or the like. In the flash memory, since the voltage applied to a control gate is high, it is necessary to keep a distance between cells in order to prevent the potential of the voltage from affecting the floating gate of the adjacent cell. This is one of inhibiting factors for high integration of a semiconductor device. The factor is attributed to a basic principle of a flash memory that a tunneling current flows with a high electrical field is applied.

In contrast, the semiconductor device according to this embodiment is operated by switching of the transistor using an oxide semiconductor and does not use the above-described principle of charge injection by tunneling current. That is, a high electrical field for charge injection is not necessary unlike a flash memory. Accordingly, it is not necessary to consider an adverse effect of a high electrical field of a control gate on the adjacent cell, which facilitates high integration.

In addition, it is also advantageous over a flash memory that a high electrical field is unnecessary and a large peripheral circuit (such as a booster circuit) is unnecessary. For example, the highest voltage applied to the memory cell can be reduced to less than or equal to 5 V, preferably less than or equal to 3 V in each memory cell in the case where data with two levels (one bit) is written.

A combination of such structures enables further higher integration.

<Driving Method 2>

Figure 1B:
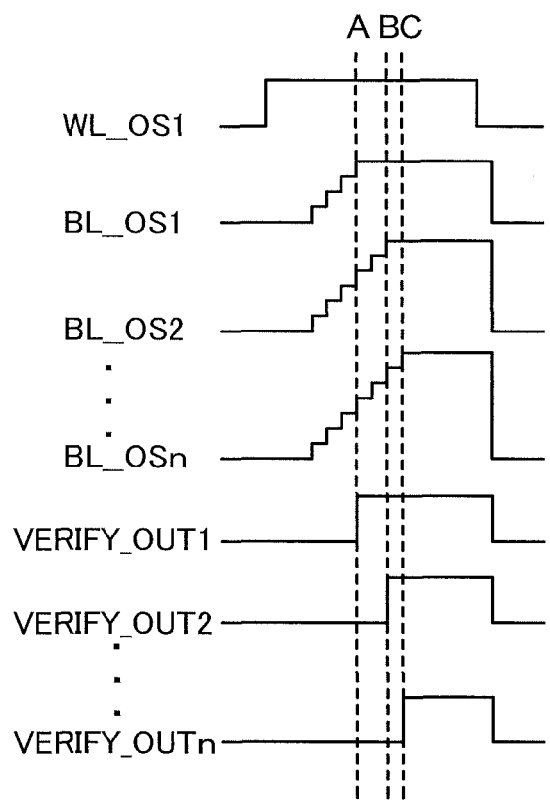

Next, another driving method of the semiconductor device with the circuit configuration shown in FIG. 1A, which is different from Driving Method 1, is described using FIG. 1B.

FIG. 1B is a timing chart of the semiconductor device with the circuit configuration shown in FIG. 1A. First, a potential is supplied to the first word line for an oxide semiconductor (WL_OS1) to turn on the second transistor 202. Next, the potential of the first bit line for an oxide semiconductor (BL_OS1) is increased step-by-step while verifying the reading current (Imat_Step), so that a verification result 1 (VERIFY_OUT1) takes a "HIGH" state when the reading current (Imat_Step) reaches a given potential (Time A). Upon referring the verification result 1 (VERIFY_OUT1), the potential supplied to the first bit line for an oxide semiconductor (BL_OS1) while increasing step-by-step is fixed, and data at that time is held in the memory.

The potential of a second bit line for an oxide semiconductor (BL_OS2) is increased step-by-step at the same time as the potential of the first bit line for an oxide semiconductor (BL_OS1), and a verification result 2 (VERIFY_OUT2)

takes a "HIGH" state at Time B when the reading current (Imat_Step) reaches a given potential which is different from that given for the first bit line for an oxide semiconductor (BL_OS1) (Time B). Upon referring the verification result 2 (VERIFY_OUT2), the potential supplied to the second bit line for an oxide semiconductor (BL_OS2) while increasing step-by-step is fixed, and data at that time is held in the memory.

The memory cells are arrayed in m rows (in the horizontal direction) by n columns (in the longitudinal direction), into which data writing is performed at one row (n memory cells (columns)) according to the method similar to the above-described method. Then, potential retention is completed at one word line (n memory cells (columns)), and then, the potential of the first bit line for an oxide semiconductor (BL_OS1) stops being supplied to turn off the second transistor 202.

In this manner, data writing at one word line (n memory cells (columns)) is completed. Next, the potential is supplied to a second word line for an oxide semiconductor (WL_OS2), and followed by the above-described operation according to the above-described driving method sequentially to the m-th word line (in the m-th row) for an oxide semiconductor (WL_OSm). Through the above, data writing into the memory cell array 240 is completed.

Data whose number of levels is three or more may be written into one memory cell, whereby the storage capacity can be increased as compared to the case where data whose number of levels is two is written. The multilevel technique can be achieved by, for example, supplying charge Q to the gate electrode of the first transistor 201, in addition to the charge $Q_L$ supplying a low potential and the charge $Q_H$ supplying a high potential. In that case, enough storage capacity can be secured even with a circuit configuration in which $F^2$ is not sufficiently small.

An n-channel transistor in which electrons are majority carriers is used in the above description; it is needless to say that a p-channel transistor in which holes are majority carriers can be used instead of the n-channel transistor.

As described above, the retaining potential is adjusted so as to provide accurate data per cell, thereby writing data while cancelling variation of transistor characteristics between cells. Accordingly, the reliability for data writing and data reading as a memory is significantly improved.

The structures, methods, and the like described in this embodiment can be combined as appropriate with any of the structures, methods, and the like described in the other embodiments.

(Embodiment 2)

Next, a more specific circuit structure applying the circuit shown in FIGS. 1A and 1B, and a driving method thereof will be described with reference to FIG. 2, FIGS. 3A and 3B, FIG. 4, and FIGS. 5A and 5B.

<Application Example 1>

Figure 2:
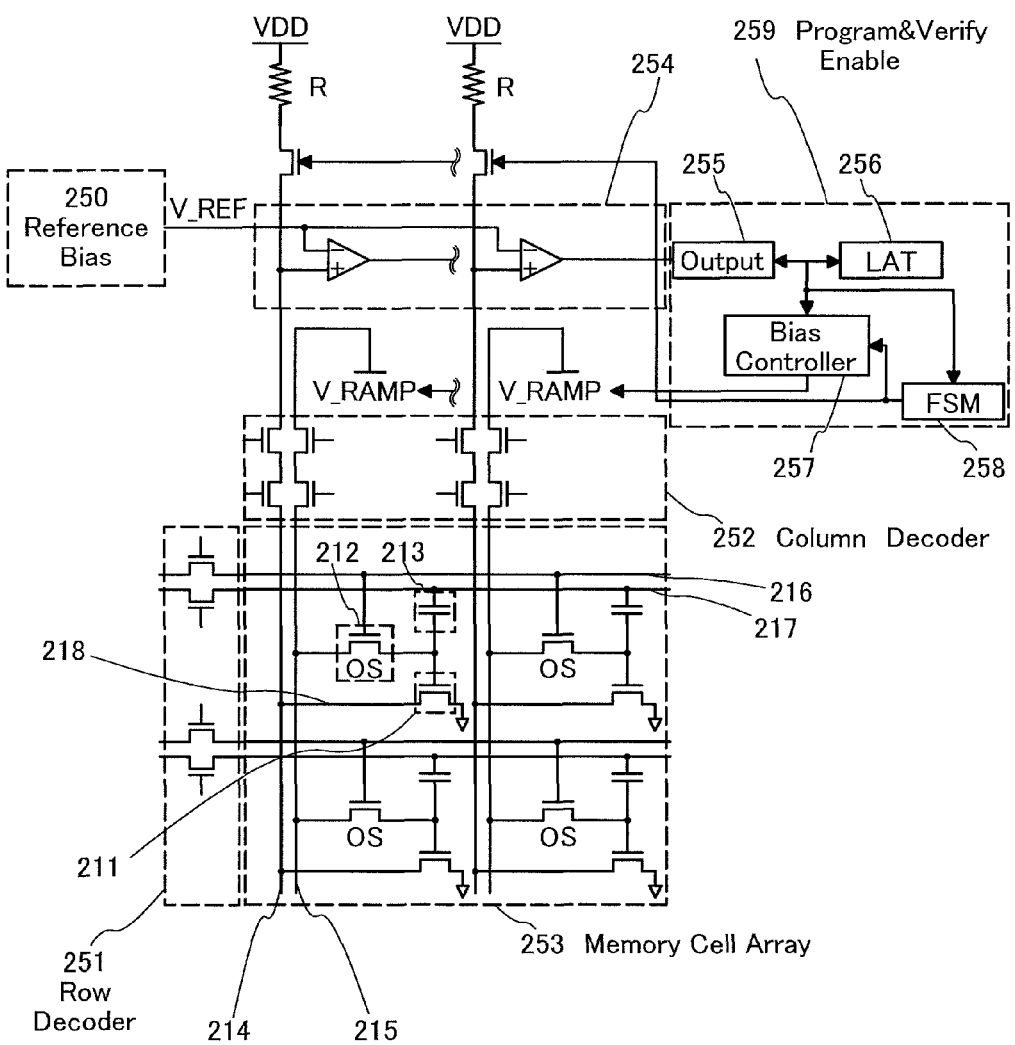
FIG. 2 is a circuit diagram of a semiconductor device.

FIG. 2 illustrates an example of NOR-type memory circuit structure (1 bit per cell). The circuit structure shown in FIG. 2 includes a set potential circuit 250 (Reference Bias) for sending a signal of a set potential; a word line selection circuit 251 (Row Decoder) for selecting/controlling an address of a word line; a bit line selection circuit 252 (Column Decoder) for selecting/controlling an address of a bit line; a memory cell array 253 for holding data; a potential comparison circuit 254 (also called a sense amplifier) for comparing the set potential with a potential of the memory cell array 253; and a control circuit 259 for control and verification.

The control circuit 259 includes an output circuit 255 (Output) for outputting OR from the potential comparison circuit 254, a latch circuit 256 (LAT) which can latch an output from the output circuit 255, a potential control circuit 257 (Bias Controller) for controlling a potential by a signal from the latch circuit 256, and a state transition circuit 258 (FSM: finite state machine) for control.

The memory cell array 253 includes a plurality of memory cells each including a first transistor 211, a second transistor 212, a capacitor 213, a first bit line 214, a first bit line for an oxide semiconductor 215, a first word line for an oxide semiconductor 216, and a first word line 217.

A driving method of the circuit structure shown in FIG. 2 is described below.

In writing data (for example, data "1") into a memory cell, signals are supplied from the state transition circuit 258 (FSM) for control to various circuits (e.g., the word line selection circuit 251, the potential comparison circuit 254, the potential control circuit 257, and the like), thereby starting data writing and reading.

For example, the writing voltage for a selected word line, the reading voltage for a selected word line, the writing voltage for a non-selected word line, and the reading voltage for a non-selected word line of the word line selection circuit 251 can be set to 3 V, 0 V, −3 V, and −3 V, respectively. As described above, since data writing and reading are performed at the same time, negative potentials are supplied to the non-selected word lines, thereby preventing miswriting of data.

Next, the potential control circuit 257 increases the writing voltage (V_RAMP) step-by-step. This step is performed at the same time on one word line. While increasing the writing voltage (V_RAMP) step-by-step, a reading value is detected, for which a value output from the potential comparison circuit 254 to the output circuit 255 is monitored. That is, data "0" is detected first in the output circuit 255, and then when the writing voltage (V_RAMP) reaches a set potential output from the set potential circuit 250, data "1" is detected by the output circuit 255. Upon detection of data "1" by the output circuit 255, the potential control circuit 257 stops increasing the writing voltage (V_RAMP) and keeps the voltage. Note that in the case of writing data "0", the writing voltage (V_RAMP) is not increased. Upon detection of a verification result that a signal from a memory cell in one word line, into which data "1" is to be written, is data "1", the potential control circuit 257 sends a signal to the word line selection circuit 251, so that the potential stops being supplied to the word line to turn off the second transistor 212.

Completion of data writing in one word line is followed by selection of the next word line, and data writing is performed therein in the manner similar to the above manner. Upon completion of the data writing into all the memory cells, the control circuit 259 is turned off.

Figure 3A:
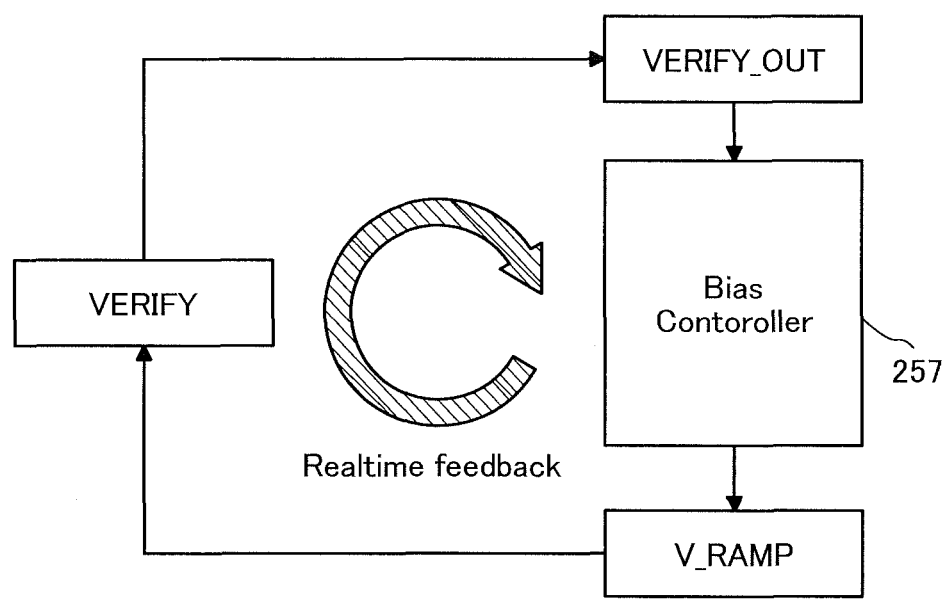
FIGS. 3A and 3B are a pattern diagram and a timing chart of a semiconductor device.
Figure 3B:
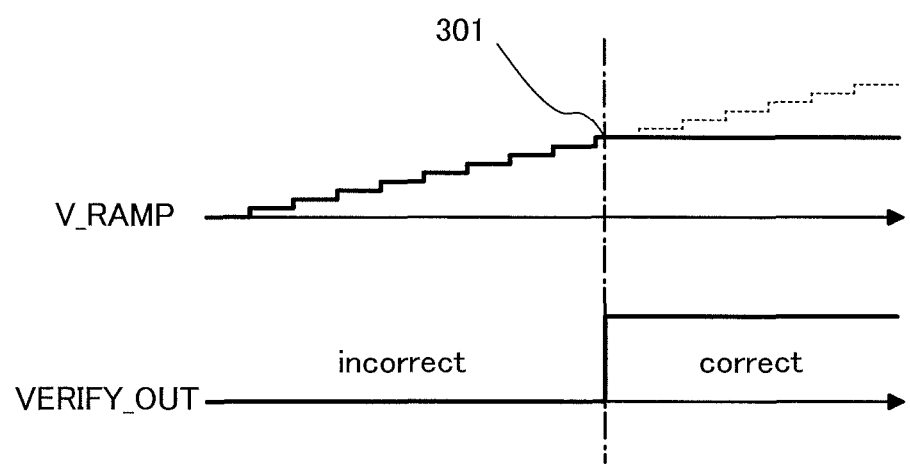

Next, the driving method of the potential control circuit 257 shown in FIG. 2 is described in detail using FIGS. 3A and 3B. FIG. 3A is a pattern diagram of the driving method of the potential control circuit 257, and FIG. 3B is a timing chart of the potential control circuit 257.

The driving method of the potential control circuit 257 is as follows: the writing voltage (V_RAMP) is increased step-by-step, the reading value is verified (VERIFY), and the result is fed back to the potential control circuit 257 (see FIG. 3A). When the verification result (VERIFY_OUT) reaches a set potential, the potential control circuit 257 stops increasing the writing voltage (V_RAMP) and keeps the voltage.

The potential control circuit 257 is preferably provided individually for each bit line; however, one embodiment of the present invention is not limited thereto. One potential control circuit 257 and a switching circuit may be controlled in combination. In that case, signal delay or the like might occur depending on the circuit structure, and thus design is changed as appropriate.

The timing chart shown in FIG. 3B illustrates the driving method of FIG. 3A. Until the writing voltage (V_RAMP) reaches a set potential 301, the verification result (VERIFY_OUT) is incorrect with respect to the set potential 301, and thus the writing voltage (V_RAMP) is increased step-by-step. Then, when the writing voltage (V_RAMP) reaches the set potential 301, a correct signal (correct) with respect to the set potential 301 is sent as the verification result (VERIFY_OUT) to the potential control circuit 257, so that the writing voltage (V_RAMP) is fixed.

Figure 4:
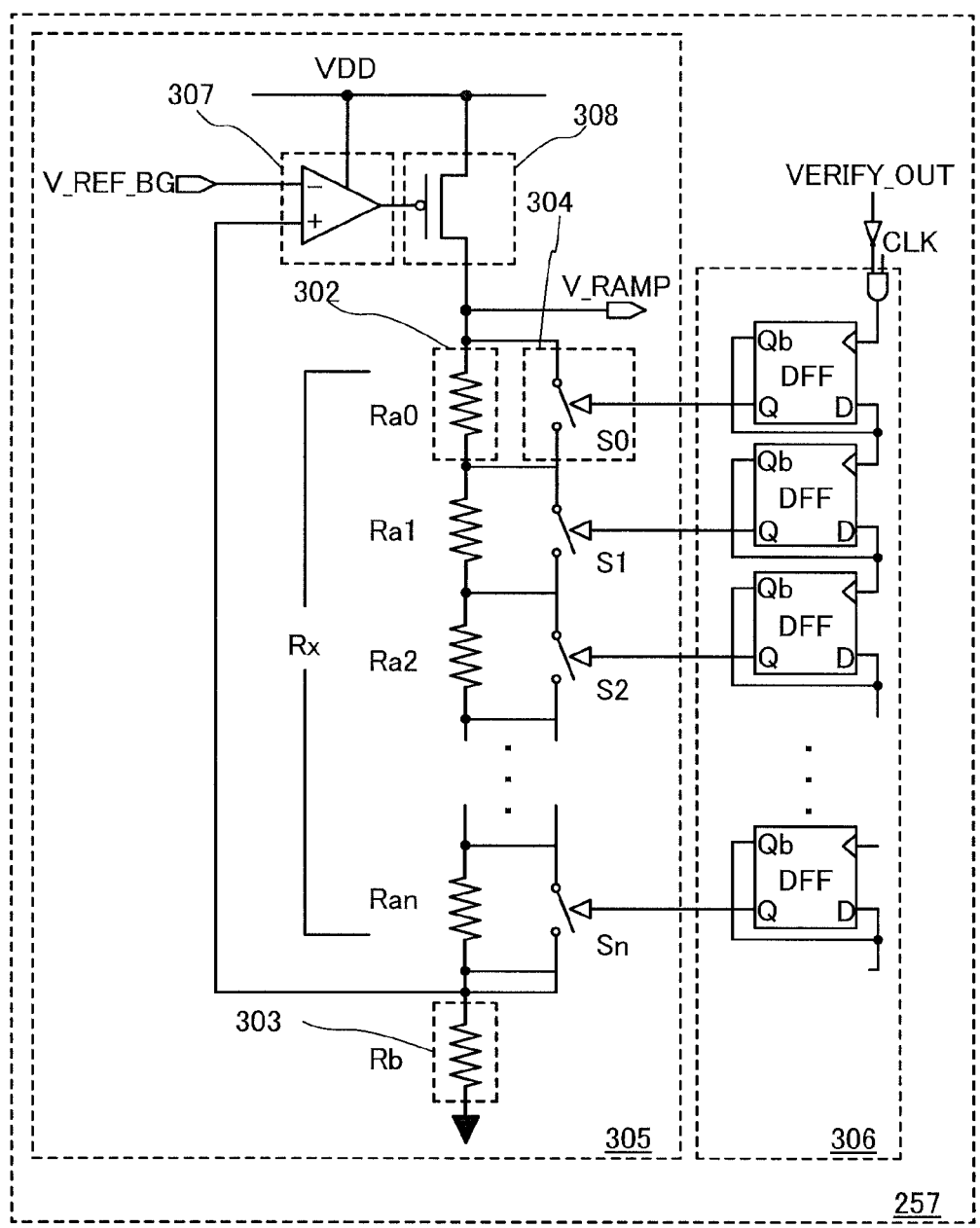
FIG. 4 is a circuit diagram of a semiconductor device.
Figure 5A:
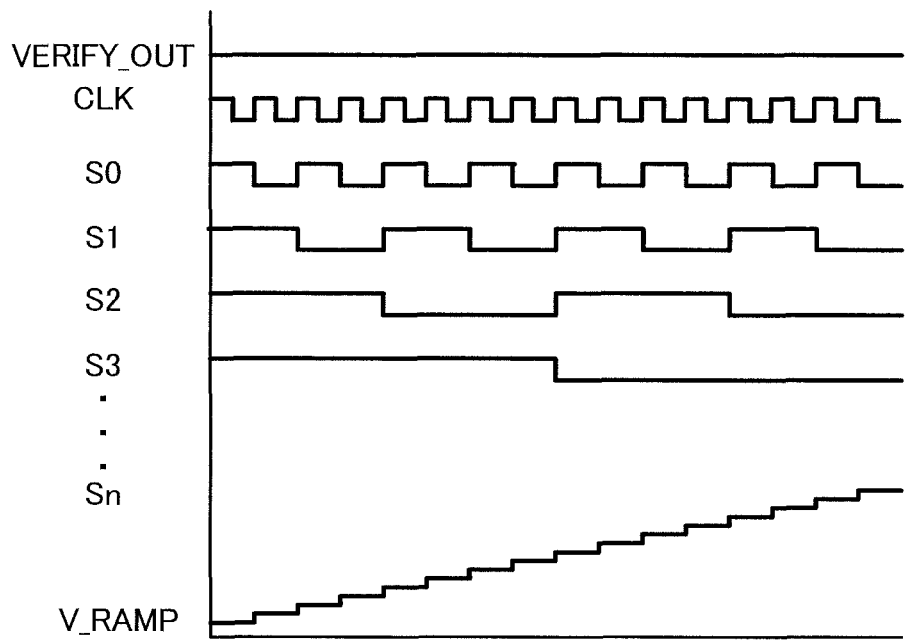
FIGS. 5A and 5B are timing charts.
Figure 5B:
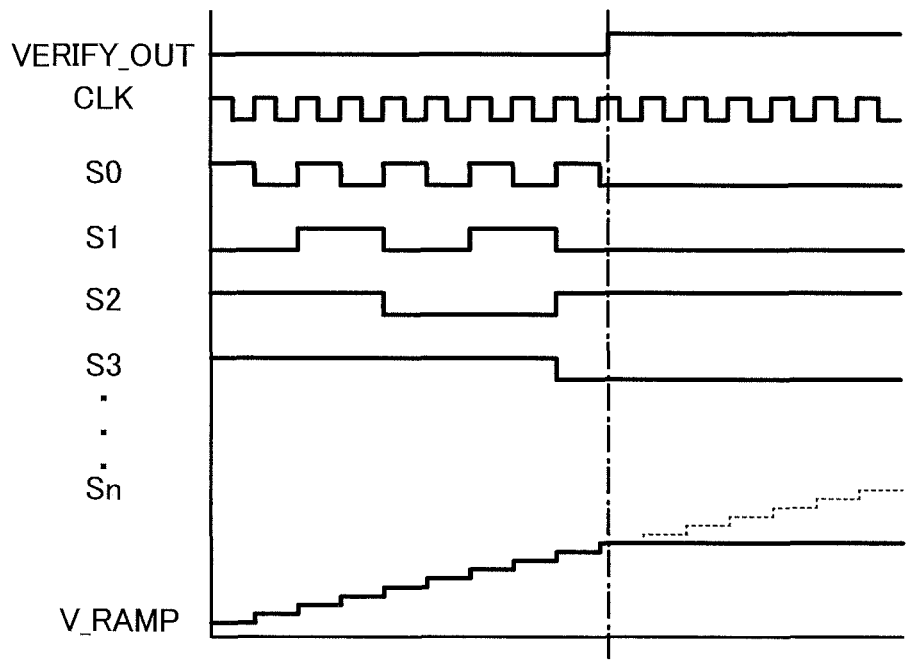

Next, a circuit structure and a specific structure of the driving method of the potential control circuit 257 illustrated in FIG. 2 and FIGS. 3A and 3B are described using FIG. 4 and FIGS. 5A and 5B.

FIG. 4 illustrates one example of the circuit structure of the potential control circuit 257.

The potential control circuit 257 includes a regulator circuit 305 including a potential comparator 307, a transistor 308, a plurality of resistors 302, a resistor 303, and a plurality of switches 304, and a counter circuit 306 including a plurality of DFF circuits (DFF circuit is a kind of flip-flop circuit).

In FIG. 4, the number of the plurality of resistors 302 is n (n is a natural number greater than or equal to 2), and the plurality of resistors 302 are shown with respective reference symbols Ra0, Ra1, Ra2, . . . Ran. The total resistance of the plurality of resistors 302 is represented by Rx. Similarly to the plurality of resistors 302, the number of the plurality of switches 304 is also n (n is a natural number greater than or equal to 2), and the plurality of switches 304 are shown with respective reference symbols S0, S1, S2, . . . Sn.

Note that a signal V_REF_BG input to the potential comparator 307 of the regulator circuit 305 is different from V_REF output from the set potential circuit 250 shown in FIG. 2. The signal V_REF_BG is a reference potential for increasing the potential step-by-step, to which a potential almost equal to the threshold voltage (0.5 V to 1.0 V) of the transistor included in the circuit is preferably supplied.

FIGS. 5A and 5B are timing charts illustrating the driving method of the potential control circuit 257 shown in FIG. 4. In FIGS. 5A and 5B, VERIFY_OUT denotes a verification result, CLK denotes a clock signal, S0 to Sn denote respective output potentials of the switches S0 to Sn, and V_RAMP denotes a power source potential.

The clock signal CLK is input to the counter circuit 306 in the potential control circuit 257 to trigger the counter operation, so that the potentials of the switches (S0 to Sn) change accordingly. In addition, depending on the states of the switches, the resistance (Rx) is changed. With the connection in series of the plurality of resistors and the connection in series of the plurality of switches such that the resistance (Rx) increases as the counter operation proceeds, the writing voltage (V_RAMP) increases step-by-step as the resistance (Rx) increases (see FIG. 5A).

The verification result (VERIFY_OUT) becomes "1" while the writing voltage (V_RAMP) increases, so that the counter operation stops and the states of the switches stop being changed, whereby the voltages are fixed (see FIG. 5B).

In the above-described circuit structure, the writing voltage (V_RAMP) can be obtained by the following formula, where V_RAMP denotes the writing voltage, V_REF_BG denotes the reference potential for increasing the potential step-by-step, Rb denotes a resistance of the resistor 303, and Rx denotes the total resistance of the plurality of resistors 302 (Ra0 to Ran).

$$\text{V\_RAMP} = \text{V\_REF\_BG} \cdot \left(1 + \frac{Rx}{Rb}\right) \quad [\text{FORMULA 1}]$$

That is, as the resistance (Rx) increases, the writing voltage (V_RAMP) increases.

The circuit structure of the potential control circuit 257 is not particularly limited to the above as long as the function similar to the function described in Embodiment 1 is fulfilled.

As described above, the reading current is read to refer the verification result (VERIFY_OUT) while increasing the writing voltage (V_RAMP) step-by-step, so that the writing voltage (V_RAMP) is fixed. Accordingly, data can be written with a set potential even when there are variations in characteristics of the second transistor 212 that is a writing transistor and/or the first transistor 211 that is a reading transistor. Consequently, reliability for the data writing and data reading is significantly improved.

The structures, methods, and the like described in this embodiment can be combined as appropriate with any of the structures, methods, and the like described in the other embodiments.

(Embodiment 3)

Next, a circuit structure which is different from the circuit structure illustrated in FIG. 2, and a driving method thereof will be described with reference to FIG. 6 and FIGS. 7A-1, 7A-2, 7A-3, 7A-4, 7B-1, 7B-2, 7B-3, and 7B-4.

<Application Example 2>

Figure 6:
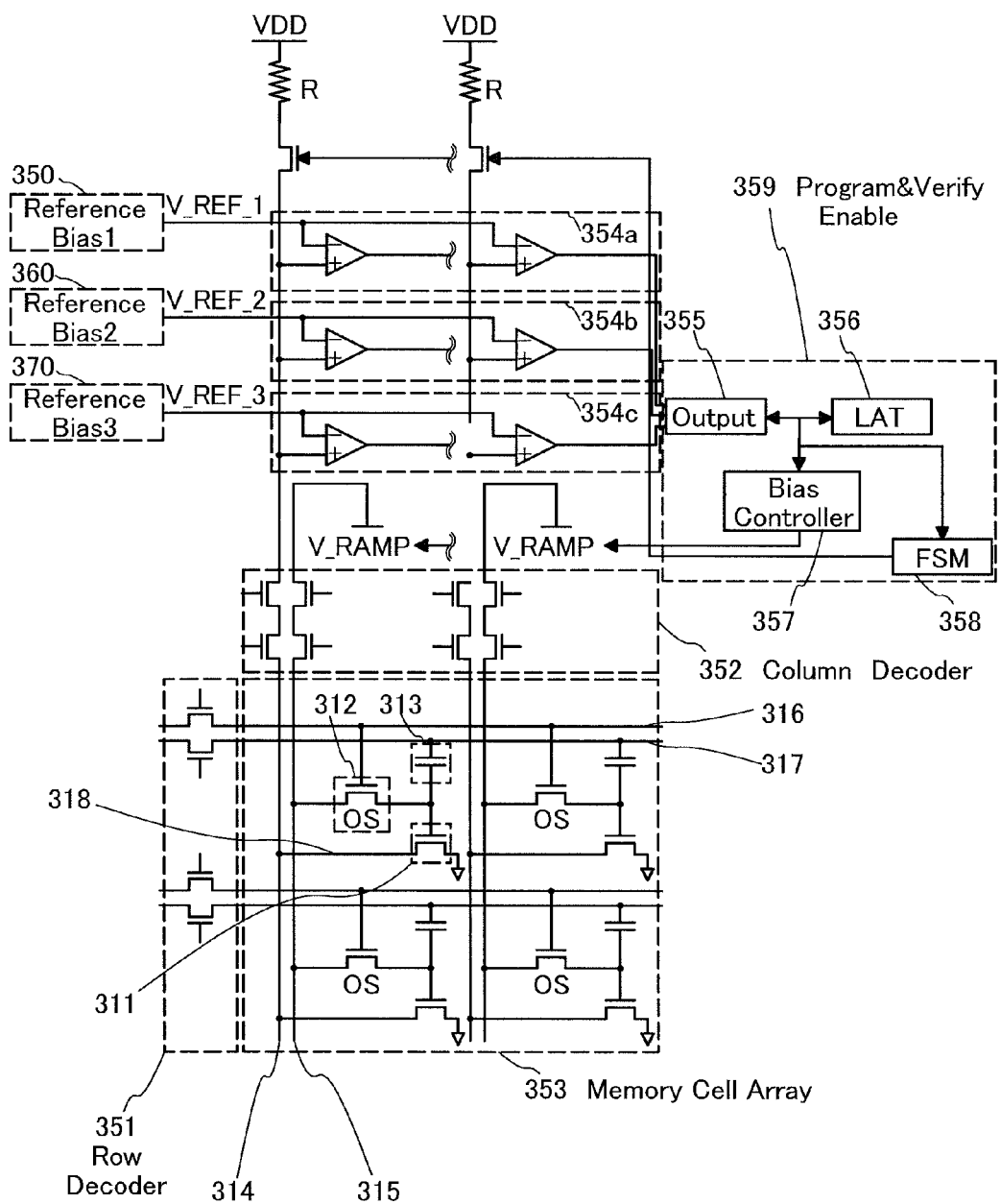
FIG. 6 is a circuit diagram of a semiconductor device.

The difference between FIG. 2 and FIG. 6 is that the circuit structure shown in FIG. 2 is a memory circuit with 1 bit per cell whereas a circuit structure shown in FIG. 6 is a memory circuit with 2 bits per cell.

The memory circuit shown in FIG. 6 includes a set potential circuit 350 (Reference Bias1) for sending a signal of a set potential; a set potential circuit 360 (Reference Bias2) for sending a signal of a set potential; a set potential circuit 370 (Reference Bias3) for sending a signal of a set potential; a word line selection circuit 351 (Row Decoder) for selecting/controlling an address of a word line; a bit line selection circuit 352 (Column Decoder) for selecting/controlling an address of a bit line; a memory cell array 353 for holding data; a potential comparison circuits 354a, 354b, and 354c for comparing respective set potentials output from the set potential circuits 350, 360, and 370 with a potential of the memory cell array 253; and a control circuit 359 for control and verification.

The control circuit 359 includes an output circuit 355 (Output) for outputting OR from the potential comparison circuits 354a, 354b, and 354c, a latch circuit 356 (LAT) which can latch an output from the output circuit 355, a potential control circuit 357 (Bias Controller) for controlling a potential by a signal from the latch circuit 356, and a state transition circuit 358 (FSM) for control.

The memory cell array 353 includes a plurality of memory cells each including a first transistor 311, a second transistor 312, a capacitor 313, a first bit line 314, a first bit line for an oxide semiconductor 315, a first word line for an oxide semiconductor 316, and a first word line 317.

The structure of the memory circuit shown in FIG. 6 involves 3 set potential circuits for sending signals of set potentials in order to divide a retention voltage into 4 values. In addition, the potential comparison circuits for comparison with respective to set potentials output from the set potential circuits are also involved in accordance with the set potential circuits.

A driving method of the circuit structure shown in FIG. 6 is described below using the timing charts show in FIGS. 7A-1, 7A-2, 7A-3, 7A-4, 7B-1, 7B-2, 7B-3, and 7B-4.

The set potential at which the verification result (VERIFY_OUT) is "1" is different depending on data. Therefore, such a set potential is determined by the set potential circuit among the set potential circuits 350, 360, and 370, which is targeted to verify the set potential.

Figure 7:
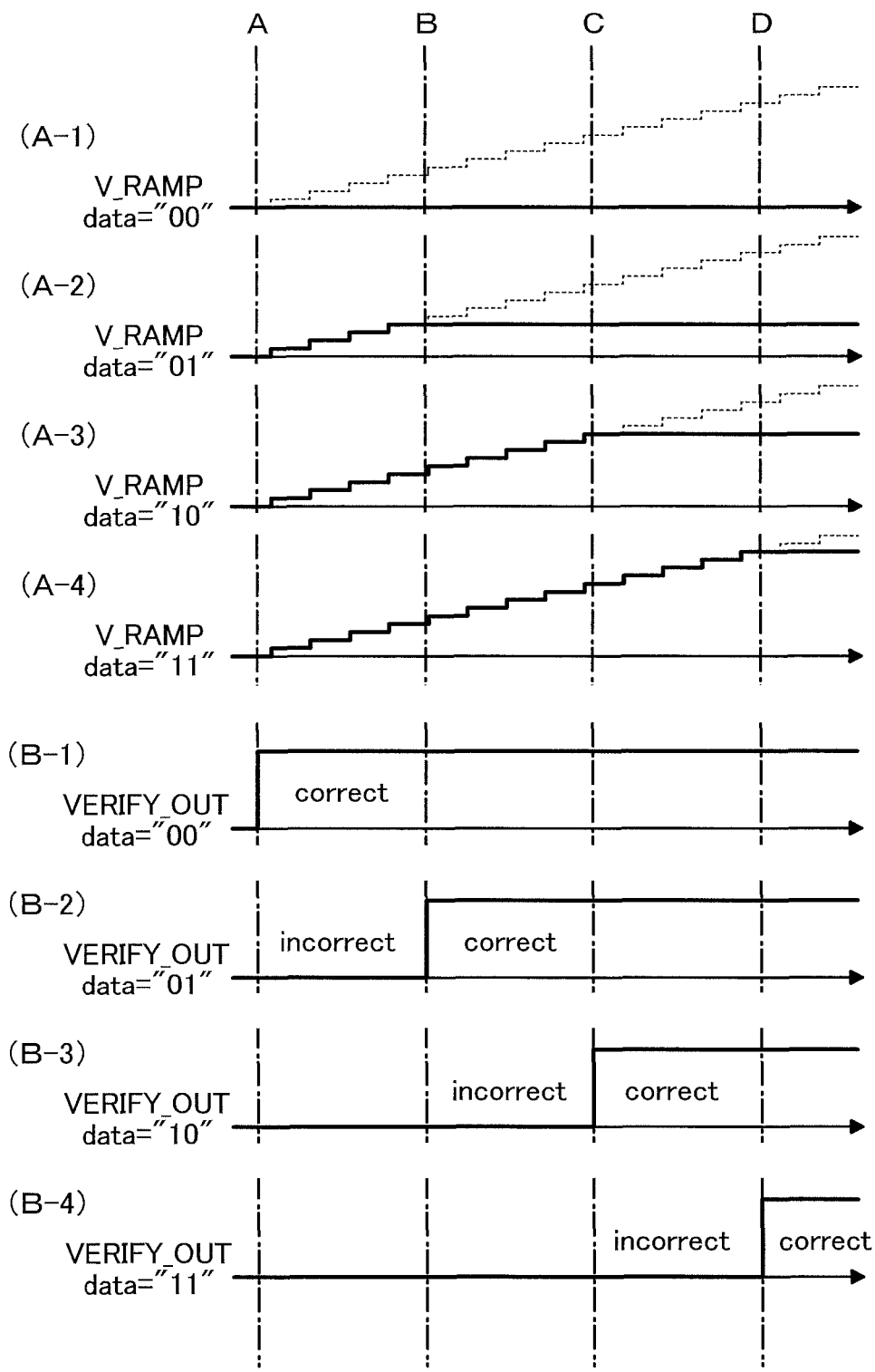

FIG. 7A-1 illustrates the writing voltage (V_RAMP) in the case where the set potential is data="00", and FIG. 7B-1 illustrates the verification result (VERIFY_OUT) at that time. At time A, the writing voltage (V_RAMP) already satisfies the set potential, so that a signal which is correct with respect to the set potential, correct, is sent as the verification result (VERIFY_OUT) to the potential control circuit 357 to fix the writing voltage (V_RAMP). That is, the correct signal is output before the writing voltage (V_RAMP) increases, whereby the writing voltage (V_RAMP) is not increased.

FIG. 7A-2 illustrates the writing voltage (V_RAMP) in the case where the set potential is data="01", and FIG. 7B-2 illustrates the verification result (VERIFY_OUT) at that time. Until time B, the writing voltage (V_RAMP) is lower than the set potential and therefore the writing voltage (V_RAMP) is kept increasing step-by-step; when the writing voltage (V_RAMP) satisfies the set potential at time B, a signal which is correct with respect to the set potential, correct, is sent as the verification result (VERIFY_OUT) to the potential control circuit 357 to fix the writing voltage (V_RAMP).

FIG. 7A-3 illustrates the writing voltage (V_RAMP) in the case where the set potential is data="10", and FIG. 7B-3 illustrates the verification result (VERIFY_OUT) at that time. Until time C, the writing voltage (V_RAMP) is lower than the set potential and therefore the writing voltage (V_RAMP) is kept increasing step-by-step; when the writing voltage (V_RAMP) satisfies the set potential at time C, a signal which is correct with respect to the set potential, correct, is sent as the verification result (VERIFY_OUT) to the potential control circuit 357 to fix the writing voltage (V_RAMP).

FIG. 7A-4 illustrates the writing voltage (V_RAMP) in the case where the set potential is data="11", and FIG. 7B-4 illustrates the verification result (VERIFY_OUT) at that time. Until time D, the writing voltage (V_RAMP) is lower than the set potential and therefore the writing voltage (V_RAMP) is kept increasing step-by-step; when the writing voltage (V_RAMP) satisfies the set potential at time D, a signal which is correct with respect to the set potential, correct, is sent as the verification result (VERIFY_OUT) to the potential control circuit 357 to fix the writing voltage (V_RAMP).

As described above, the reading current is read while increasing the writing voltage (V_RAMP), whereby data can be written with a set potential even when there are variations in characteristics of the first transistor 311 that is a reading transistor and/or the second transistor 312 that is a writing transistor.

Further, the retaining potential is adjusted so as to provide accurate data per memory cell, thereby writing data while cancelling variation of transistor characteristics between memory cells. Accordingly, the reliability for data writing and data reading is significantly improved in the memory cell with the circuit structure of 2 bits per cell described in this embodiment.

The structure, method, and the like described in this embodiment can be combined as appropriate with any of the structures, methods, and the like described in the other embodiments.

(Embodiment 4)

In this embodiment, a structure and a manufacturing method of a semiconductor device according to one embodiment of the present invention will be described with reference to FIGS. 8A and 8B, FIGS. 9A to 9D, and FIGS. 10A to 10D.

<Cross-Sectional Structure and Planar Structure of Semiconductor Device>

Figure 8A:
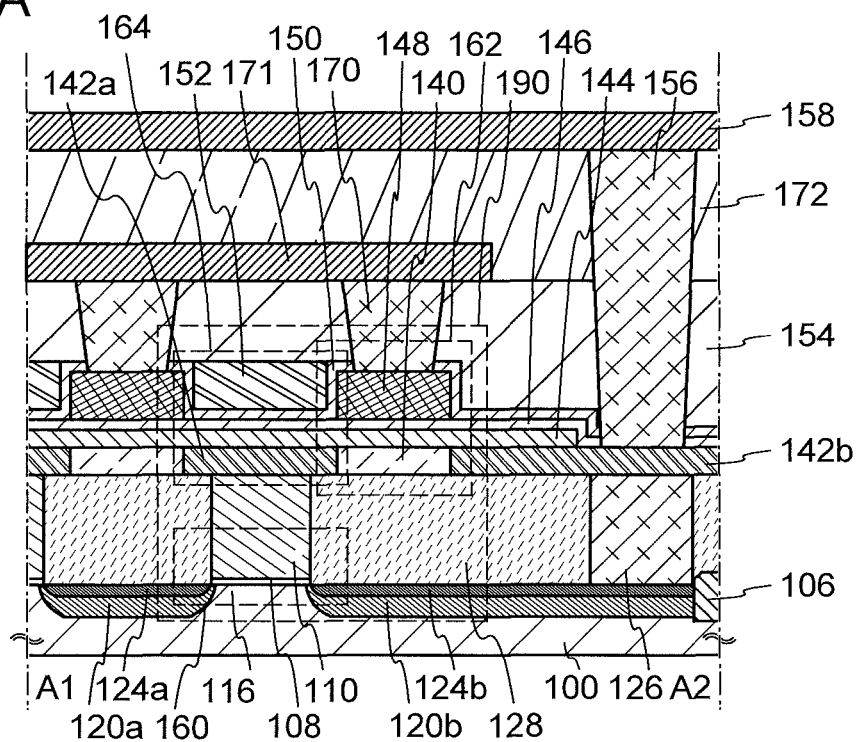
FIGS. 8A and 8B are a cross-sectional view and a plan view of a semiconductor device.
Figure 8B:
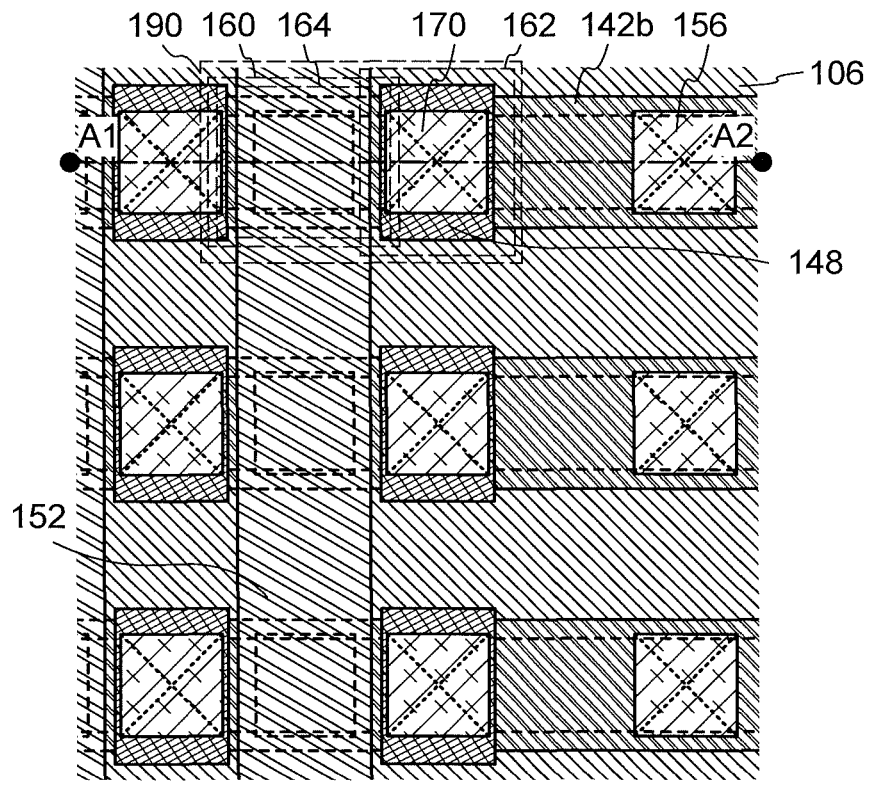

FIGS. 8A and 8B illustrate one example of a structure of a semiconductor device to which the memory cell array 240 shown in FIG. 1A, the memory cell array 253 shown in FIG. 3, or the memory cell array 353 shown in FIG. 6 is applied. FIG. 8A illustrates a cross section of the semiconductor device, and FIG. 8B illustrates a plan view of the semiconductor device. FIG. 8A corresponds to a cross section along line A1-A2 in FIG. 8B. In FIG. 8B, some of components of the semiconductor device (insulating layers 154 and 172 and wirings 171 and 158) are omitted in order to avoid complexity. The semiconductor device illustrated in FIGS. 6A and 6B includes a first transistor 160 using a first semiconductor material in the lower portion, and a second transistor 162 using a second semiconductor material and a capacitor 164 in the upper portion.

The first transistor 160, the second transistor 162, and the capacitor 164 correspond to the following respectively: the first transistor 201, the second transistor 202, and the capacitor 203 in the memory cell array 240; the first transistor 211, the second transistor 212, and the capacitor 213 in the memory cell array 253; the first transistor 311, the second transistor 312, and the capacitor 313 in the memory cell array 353.

It is preferable that the first semiconductor material be different from the second semiconductor material. For example, the first semiconductor material may be a semiconductor material other than an oxide semiconductor (e.g., silicon) and the second semiconductor material may be an oxide semiconductor. A transistor using a material other than an oxide semiconductor can operate at high speed easily. On the other hand, a transistor using an oxide semiconductor can retain charge for a long time owing to its characteristics.

Although all the transistors are n-channel transistors in this embodiment, it is needless to say that p-channel transistors can be used. As long as a semiconductor material with which off-state current can be sufficiently reduced, such as an oxide semiconductor, is used for the second transistor 162 so that data can be retained, it is not necessary to limit a specific structure of the semiconductor device, such as materials of the semiconductor device or a structure of the semiconductor device, to the structure described in this embodiment.

The first transistor 160 in FIGS. 8A and 8B includes a channel formation region 116 provided in a substrate 100 including a semiconductor material (such as silicon), an impurity region 120a and an impurity region 120b provided so as to sandwich the channel formation region 116 therebetween, a metal compound region 124a and a metal compound region 124b in contact with the impurity region 120a and the impurity region 120b, a gate insulating layer 108 provided over the channel formation region 116, and a gate electrode 110 provided over the gate insulating layer 108. FIG. 8A does not illustrate a source electrode and a drain electrode expressly; however, such an element is referred to as a transistor for convenience in some cases. Further, in that case, in description of a connection of the transistor, a source region and a source electrode are collectively referred to as a "source electrode," and a drain region and a drain electrode are collectively referred to as a "drain electrode" in some cases. That is, in this description and the like, the "source electrode" may include a source region and the "drain electrode" may include a drain region.

Further, an element isolation insulating layer 106 is provided over the substrate 100 so as to surround the first transistor 160, and an insulating layer 128 is provided to cover the first transistor 160. For higher integration, it is preferable that, as in FIGS. 8A and 8B, the first transistor 160 does not have a sidewall insulating layer. However, in further consideration of the characteristics of the first transistor 160, the sidewall insulating layer may be formed on a side surface of the gate electrode 110 such that a region having a different impurity concentration is provided.

In this embodiment, the insulating layer 128 preferably has a surface with favorable planarity; for example, the root-mean-square (RMS) roughness of the surface of the insulating layer 128 is preferably 1 nm or less.

The second transistor 162 in FIGS. 8A and 8B includes a source electrode 142a and a drain electrode 142b in an insulating layer 140 formed over the insulating layer 128; an oxide semiconductor layer 144 in contact with the insulating layer 140, and respective parts of the source electrode 142a and the drain electrode 142b; a gate insulating layer 146 covering the oxide semiconductor layer 144; and a gate electrode 148 provided over the gate insulating layer 146 so as to overlap with the oxide semiconductor layer 144.

Here, the oxide semiconductor layer 144 is preferably a highly-purified oxide semiconductor layer by sufficiently removing impurities such as hydrogen and/or sufficiently supplying oxygen. Specifically, for example, the hydrogen concentration of the oxide semiconductor layer 144 is $5 \times 10^{19}$ atoms/cm$^3$ or less, preferably $5 \times 10^{18}$ atoms/cm$^3$ or less, further preferably $5 \times 10^{17}$ atoms/cm$^3$ or less. Note that the hydrogen concentration of the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect levels in the energy gap due to oxygen deficiency are reduced by sufficient supply of oxygen, the density of carriers due to a donor such as hydrogen is less than $1 \times 10^{12}$/cm$^3$, preferably less than $1 \times 10^{11}$/cm$^3$, further preferably less than $1.45 \times 10^{10}$/cm$^3$. In addition, for example, the off-state current (per unit channel width (1 μm) in this embodiment) at room temperature (25° C.) is 100 zA (1 zA (zeptoampere) is $1 \times 10^{-21}$ A) or less, preferably 10 zA or less. The second transistor 162 with extremely excellent off-state current characteristics can be obtained with the use of such an oxide semiconductor that is highly purified to be intrinsic (i-type) or substantially intrinsic (i-type).

It is preferable that the root-mean-square (RMS) roughness of a region which is part of a surface of the insulating layer 140 and in contact with the oxide semiconductor layer 144 be 1 nm or less. In this manner, by providing the channel formation region of the second transistor 162 in an extremely flat region having a root-mean-square (RMS) roughness of 1 nm or less, the second transistor 162 where a defect such as a short-channel effect is prevented and favorable characteristics are exhibited can be provided even when miniaturized.

An insulating layer 150 is provided over the second transistor 162, and the insulating layer 154 is provided over the insulating layer 150 and an electrode 152 of the capacitor 164. An opening is formed in the insulating layers 150 and 154 to reach the gate electrode 148, in which an electrode 170 is formed. Over the insulating layer 154, the wiring 171 is formed in contact with the electrode 170 formed in the insulating layer 154, whereby the gate electrode 148 is electrically connected to the wiring 171. The insulating layer 172 is provided over the wiring layer 154 and the wiring 171.

In an opening formed in the gate insulating layer 146, the insulating layer 150, the insulating layer 154, and the insulating layer 172, an electrode 156 is provided. The wiring 158 which is connected to the electrode 156 is formed over the insulating layer 172. The wiring 158 is electrically connected to the metal compound region 124b functioning as a drain region of the first transistor 160 via the electrode 156 provided in the opening formed in the gate insulating layer 146, the insulating layer 150, the insulating layer 154, and the insulating layer 172, the drain electrode 142b in the insulating layer 140, and an electrode 126 in the insulating layer 128.

The structure of a semiconductor device according to one embodiment of the present invention is not limited to that illustrated in FIGS. 8A and 8B. As long as a stacked-layer structure using an oxide semiconductor and a material other than an oxide semiconductor is formed, details such as connection of an electrode or the like can be changed as appropriate.

Next, an example of a method for manufacturing the semiconductor device is described below. First, a method for manufacturing the first transistor 160 in the lower portion is described below with reference to FIGS. 9A to 9D and FIGS. 10A to 10D; then, a method for manufacturing the second transistor 162 in the upper portion and the capacitor 164 will be described with reference to FIGS. 11A to 11D and FIGS. 12A to 12C.

Figure 9A:
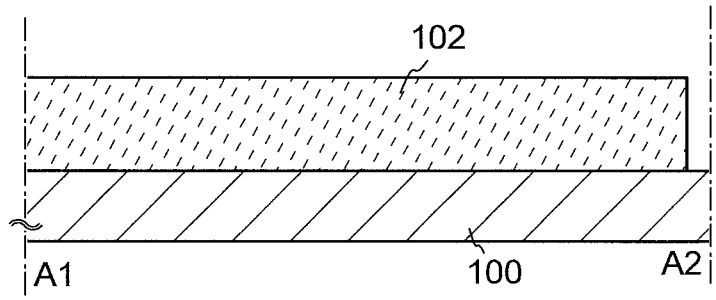
FIGS. 9A to 9D are cross-sectional views for describing a manufacturing process of a semiconductor device.
Figure 9B:
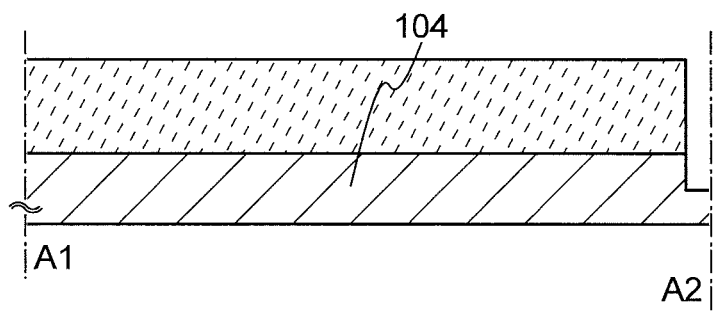

First, the substrate 100 including a semiconductor material is prepared (see FIG. 9A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. In general, the "SOI substrate" means a substrate where a silicon semiconductor layer is provided on an insulating surface; however, in this description and the like, the "SOI substrate" also means a substrate where a semiconductor layer formed using a material other than silicon is provided on an insulating surface. That is, the semiconductor layer included in the "SOI substrate" is not limited to a silicon semiconductor layer. Moreover, the SOI substrate includes in its category a substrate where a semiconductor layer is provided over an insulating substrate such as a glass substrate, with an insulating layer provided therebetween.

In this embodiment, an example of the case where a single crystal silicon substrate is used as the substrate 100 including a semiconductor material is described. A single crystal semiconductor substrate of silicon or the like is particularly preferably used as the substrate 100 including a semiconductor material, with which the speed of reading operation of the semiconductor device can be increased.

In order to control the threshold voltage of the transistor, an impurity element may be added to a region which functions as the channel formation region 116 of the first transistor 160. In this embodiment, an impurity element imparting conductivity is added such that the threshold voltage of the first transistor 160 is positive. When the semiconductor material is silicon, the impurity imparting conductivity is boron, aluminum, gallium, or the like. It is preferable to perform heat treatment after adding the impurity element, in order to activate the impurity element or reduce defects which may be generated by addition of the impurity element.

A protective layer 102 serving as a mask for forming an element isolation insulating layer is formed over the substrate 100 (see FIG. 9A). As the protective layer 102, for example, an insulating layer formed using silicon oxide, silicon nitride, silicon oxynitride or the like can be used.

Next, part of the substrate 100 in a region that is not covered with the protective layer 102 (in an exposed region) is removed by etching with the use of the protective layer 102 as a mask. Thus, a semiconductor region 104 separated from the other semiconductor region is formed (see FIG. 9B). As the etching, dry etching is preferably performed, but wet etching can be performed. An etching gas and an etchant can be selected as appropriate depending on a material of the layer to be etched.

Figure 9C:
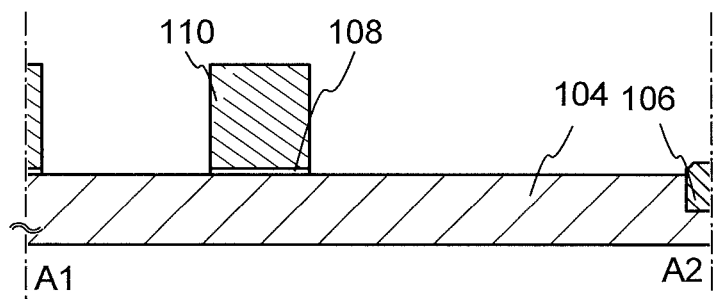

Then, an insulating layer is formed so as to cover the semiconductor region 104, and the insulating layer in a region overlapping with the semiconductor region 104 is selectively removed, whereby an element isolation insulating layer 106 is formed (see FIG. 9C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. The protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is to be a gate insulating layer and can be formed by performing heat treatment (e.g., thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and oxygen, nitrogen oxide, ammonia, nitrogen, or hydrogen. Needless to say, the insulating layer may be formed using a CVD method, a sputtering method, or the like. The insulating layer preferably has a single-layer structure or a stacked-layer structure which contains the following: silicon oxide; silicon oxynitride; silicon nitride; hafnium oxide; aluminum oxide; tantalum oxide; yttrium oxide; hafnium silicate (Hf-$Si_xO_y$ (x>0, y>0)); hafnium silicate ($HfSi_xO_y$ (x>0, y>0)) to which nitrogen is added; hafnium aluminate ($HfAl_xO_y$ (x>0, y>0)) to which nitrogen is added; and the like. The thickness of the insulating layer is, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material; a variety of film deposition methods such as an evaporation method, a CVD method, a sputtering method, or a spin coating method can be employed. Note that this embodiment shows an example of the case where the layer including a conductive material is formed using a metal material.

Then, the insulating layer and the layer including a conductive material are selectively etched, so that the gate insulating layer 108 and the gate electrode 110 are formed (see FIG. 9C).

Figure 9D:
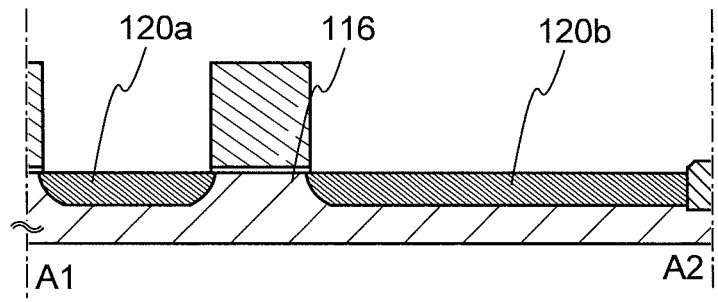

Next, phosphorus (P), arsenic (As), or the like is added to the semiconductor region 104, whereby the channel formation region 116 and the impurity regions 120 (the impurity region 120a and the impurity region 120b) are formed (see FIG. 9D). Phosphorus or arsenic is added in this embodiment in order to form an n-channel transistor; an impurity element such as boron (B) or aluminum (Al) may be added in the case of forming a p-channel transistor. The concentration of the impurity added can be set as appropriate; the concentration is preferably increased when the size of a semiconductor element is extremely decreased.

A sidewall insulating layer may be formed in the periphery of the gate electrode 110 so that an impurity region having a different impurity concentration is formed.

Figure 10A:
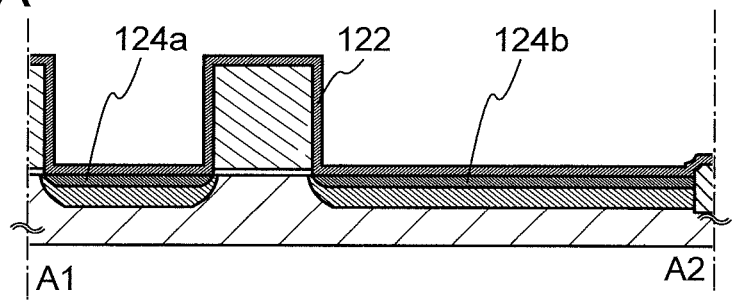
FIGS. 10A to 10D are cross-sectional views for describing a manufacturing process of a semiconductor device.

Next, a metal layer 122 is formed so as to cover the gate electrode 110, the impurity regions 120, and the like (see FIG. 10A). A variety of film formation methods such as a vacuum evaporation method, a sputtering method, or a spin coating method can be employed for forming the metal layer 122. The metal layer 122 is preferably formed using a metal material that reacts with the semiconductor material which is a component of the semiconductor region 104 to be a low-resistance metal compound. Examples of such metal materials are titanium, tantalum, tungsten, nickel, cobalt, platinum, and the like.

Next, heat treatment is performed thereon so that the metal layer 122 reacts with the semiconductor material. Thus, the metal compound regions 124 (the metal compound region 124a and the metal compound region 124b) which are in contact with the impurity regions 120 (the impurity region 120a and the impurity region 120b) are formed (see FIG. 10A). When the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that any another heat treatment method may be used, a method by which heat treatment for an extremely short time can be achieved is preferably used in order to improve the controllability of chemical reaction in formation of the metal compound. The metal compound regions are formed by reaction of the metal material and the semiconductor material and have sufficiently high conductivity. The formation of the metal compound regions can sufficiently reduce the electric resistance and improve element characteristics. The metal layer 122 is removed after the metal compound regions 124 are formed.

Figure 10B:
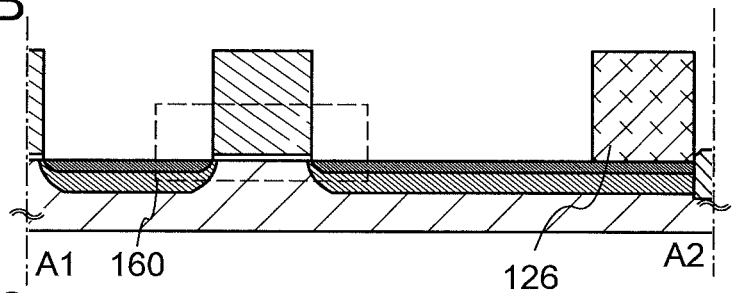

Next, the electrode 126 is formed on and in contact with the metal compound region 124b of the first transistor 160 (see FIG. 10B). The electrode 126 is formed in such a manner that a conductive layer is formed by a PVD method such as a sputtering method or a CVD method such as a plasma CVD method and then etched into a desired shape. As a material for the conductive layer, an element selected from aluminum, chromium, copper, tantalum, titanium, molybdenum, and tungsten; an alloy containing any of these elements as a component; or the like can be used. Alternatively or in addition, one or more materials selected from manganese, magnesium, zirconium, beryllium, neodymium, and scandium may be used.

Through the above process, the first transistor 160 is formed with the use of the substrate 100 including a semiconductor material (see FIG. 10B). The first transistor 160 features high-speed operation. Thus, with the use of the transistor as a reading transistor, data can be read at a high speed.

Figure 10C:
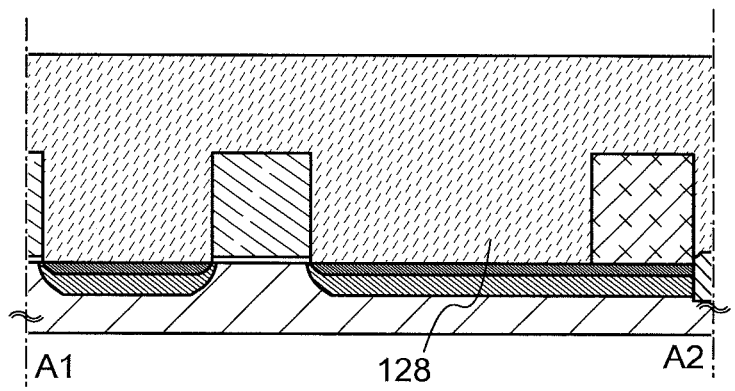

Next, the insulating layer 128 is formed so as to cover each and every components formed in the above process (see FIG. 10C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, which enables capacitance due to overlap of electrodes or wirings to be sufficiently reduced. A porous insulating layer formed using any of those materials may be used as the insulating layer 128. Since the porous insulating layer has lower dielectric constant than a dense insulating layer, capacitance due to electrodes or wirings can be further reduced. Further, the insulating layer 128 can be formed using an organic insulating material such as polyimide or acrylic resin. Although the insulating layer 128 has a single-layer structure in this embodiment, one embodiment of the present invention is not limited thereto. The insulating layer 128 may have a stacked-layer structure of two or more layers.

Figure 10D:
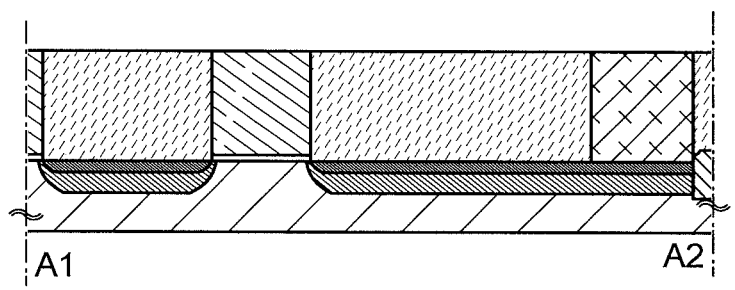

After that, as a pretreatment for the formation of the second transistor 162 and the capacitor 164, CMP treatment is performed on the insulating layer 128, so that top surfaces of the gate electrode 110 and the electrode 126 are exposed (see FIG. 10D). As the treatment for exposing the top surfaces of the gate electrode 110 and the electrode 126, etching treatment may be employed as well as CMP treatment. It is preferable to planarize the surface of the insulating layer 128 as much as possible in order to improve the characteristics of the second transistor 162; for example, it is preferable that the root-mean-square (RMS) roughness of the surface of the insulating layer 128 be 1 nm or less.

Before or after any of the above steps, a step for forming another electrode, another wiring, another semiconductor layer, or another insulating layer may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Figure 11A:
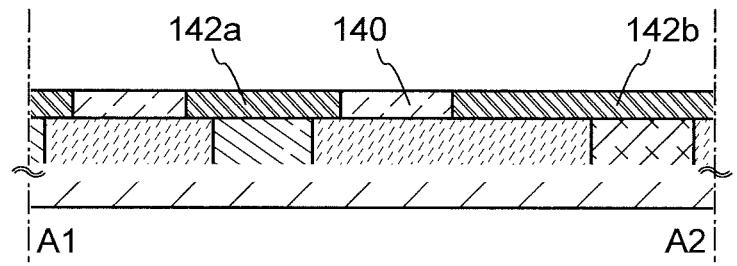
FIGS. 11A to 11D are cross-sectional views for describing a manufacturing process of a semiconductor device.

Next, a conductive layer is formed over the gate electrode 110, the electrode 126, the insulating layer 128, and the like, and is selectively etched to form the source electrode 142a and the drain electrode 142b (see FIG. 11A).

The conductive layer can be formed by a PVD method such as a sputtering method, a CVD method such as a plasma CVD method. As a material for the conductive layer, an element selected from aluminum, chromium, copper, tantalum, titanium, molybdenum, or tungsten; an alloy containing any of these elements as a component; or the like can be used. Alternatively or in addition, one or more materials selected from manganese, magnesium, zirconium, beryllium, neodymium, and scandium may be used.

The conductive layer can have a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. The conductive layer having a single-layer structure of a titanium film or a titanium nitride film has an advantage in that it can be easily processed into the source electrode 142a and the drain electrode 142b having a tapered shape.

Alternatively or in addition, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide can be used.

Although either dry etching or wet etching may be performed as the etching of the conductive layer, dry etching with high controllability is preferably used for miniaturization. The etching may be performed so that the source electrode 142a and the drain electrode 142b are tapered. The taper angle is, for example, greater than or equal to 30° and less than or equal to 60°.

The channel length (L) of the second transistor 162 in the upper portion is determined by the distance between an upper end portion of the source electrode 142a and an upper end portion of the drain electrode 142b. For light exposure for forming a mask used for a transistor with a channel length (L) of less than 25 nm, it is preferable to use extreme ultraviolet rays whose wavelength is as short as several nanometers to several tens of nanometers. With the light exposure by extreme ultraviolet rays, the resolution is high and the focus depth is large. Accordingly, the channel length (L) of the transistor can be reduced to less than 2 preferably greater than or equal to 10 nm and less than or equal to 350 nm (0.35 μm), with which a circuit can operate at higher speed. Moreover, miniaturization can lead to low power consumption of a semiconductor device.

An insulating layer serving as a base may be provided over the insulating layer 128. The insulating layer can be formed by a PVD method, a CVD method, or the like.

Next, the insulating layer 140 is formed so as to cover the source electrode 142a and the drain electrode 142b. Then, in order to planarize the insulating layer 140, chemical mechanical polishing (CMP) treatment is performed on the insulating layer 140 to planarize the insulating layer 140 so that the source electrode 142a and the drain electrode 142b are exposed to the air (see FIG. 11A).

The insulating layer 140 can be formed using a material including an inorganic insulating material such as silicon oxide, silicon oxynitride, silicon nitride, or aluminum oxide. It is particularly preferable that the insulating layer 140 be formed using silicon oxide because the oxide semiconductor layer 144 is in contact with the insulating layer 140 later. Although there is no particular limitation on the forming method of the insulating layer 140, in consideration of contact with the oxide semiconductor layer 144, a method in which hydrogen is sufficiently reduced is preferably employed. Examples of such a method are a sputtering method and the like. Needless to say, another film formation method such as a plasma CVD method may be used.

The chemical mechanical polishing (CMP) treatment is performed so as to expose at least part of surfaces of the source electrode 142a and the drain electrode 142b to the air. In addition, the CMP treatment is preferably performed under such conditions that the root-mean-square (RMS) roughness of the surface of the insulating layer 140 is reduced to 1 nm or less (preferably 0.5 nm or less). By performing the CMP treatment under such conditions, the planarity of a surface where the oxide semiconductor layer 144 is formed later can be improved to lead to improvement in characteristics of the second transistor 162.

The CMP treatment may be performed only once or plural times. When the CMP treatment is performed plural times, first polishing is preferably performed with a high polishing rate and is preferably followed by final polishing with a low polishing rate. With such a polishing at different polishing rates, the planarity of the surface of the insulating layer 140 can be further improved.

Next, an oxide semiconductor layer is formed in contact with top surfaces of the source electrode 142a, the drain electrode 142b, and the insulating layer 140, and is selectively etched to form the oxide semiconductor layer 144.

The oxide semiconductor layer 144 can be formed using the following: an In—Sn—Ga—Zn—O-based oxide semiconductor which is four-component metal oxide; an In—Ga—Zn—O-based oxide semiconductor, an In—Sn—Zn—O-based oxide semiconductor, an In—Hf—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxide; an In—O-based oxide semiconductor, a Sn—O-based oxide semiconductor, or a Zn—O-based oxide semiconductor; or the like. Further, $SiO_2$ may be contained in the above oxide semiconductor.

In particular, an In—Ga—Zn—O-based oxide semiconductor material has sufficiently high resistance when there is no electric field and thus off-state current can be sufficiently reduced; in addition, with its high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Further, using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, Ga, Ga and Al, Ga and Fe, Ga and Ni, Ga and Mn, Ga and Co, or the like can be used as M. Note that the above-described compositions are derived from the crystal structures and are just examples.

An oxide semiconductor to be used preferably contains at least indium (In) or zinc (Zn). In particular, In and Zn are preferably contained. As a stabilizer for reducing changes in electrical characteristics of a transistor using the oxide semiconductor material, gallium (Ga) is also preferably contained. Alternatively or in addition, tin (Sn) is preferably contained as a stabilizer. Alternatively or in addition, hafnium (Hf) is preferably contained as a stabilizer. Alternatively or in addition, aluminum (Al) is preferably contained as a stabilizer.

Alternatively or in addition, as a stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Ga—Zn-based oxide, an Al—Ga—Zn-based oxide, a Sn—Al—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, the In—Ga—Zn-based oxide means an oxide containing In, Ga, and Zn, and there is no limitation on the composition ratio of In, Ga, and Zn. The In—Ga—Zn-based oxide may contain any metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

As an oxide target used for forming the oxide semiconductor layer 144 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=1) (that is, $In_2O_3:Ga_2O_3:ZnO=1:1:2$ [molar ratio]) can be used. A target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can be used as well.

In this embodiment, the oxide semiconductor layer 144 is formed by a sputtering method using an In—Ga—Zn—O-based metal oxide target. The thickness thereof is greater than or equal to 1 nm and less than or equal to 50 nm, preferably greater than or equal to 2 nm and less than or equal to 20 nm, further preferably greater than or equal to 3 nm and less than or equal to 15 nm.

The metal oxide contained in the metal oxide target has a relative density of 80% or higher, preferably 95% or higher, further preferably 99.9% or higher. The use of a metal oxide target having high relative density makes it possible to form an oxide semiconductor layer with a dense structure.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high purity gas atmosphere in which an impurity such as hydrogen, water, a hydroxyl group, hydride, or the like has been reduced to a concentration of 1 ppm or less (preferably to a concentration of 10 ppb or less), for example.

In forming the oxide semiconductor layer 144, for example, an object to be processed is held in a treatment chamber kept under reduced pressure and the object is heated to a temperature of higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (25° C.±10° C.). Then, a sputtering gas from which hydrogen, water, and the like have been removed is introduced into the treatment chamber while moisture in the treatment chamber is removed, so that the oxide semiconductor layer 144 is formed using the aforementioned target. By forming the oxide semiconductor layer 144 while heating the object to be processed, impurities can be prevented from entering the oxide semiconductor layer 144. In addition, damage due to sputtering can be suppressed. In order to remove moisture in the treatment chamber, an entrapment vacuum pump is preferably used. For example, a cryopump, an ion pump, a titanium sublimation pump, or the like can be used. Alternatively, a turbo molecular pump provided with a cold trap may also be used. By performing evacuation with the use of a cryopump or the like, hydrogen, water, and the like can be removed from the treatment chamber; thus, the impurity concentration in the oxide semiconductor layer can be low.

Further, as for the oxide semiconductor layer 144, in addition to the concentration of the above-described impurity such as hydrogen or water, it is also necessary to reduce the concentration of impurity such as an alkali metal or an alkaline earth metal. Specifically, the Na concentration is reduced to $5\times10^{16}$ cm$^{-3}$ or less, preferably to $1\times10^{16}$ cm$^{-3}$ or less, further preferably to $1\times10^{15}$ cm$^{-3}$ or less; the Li concentration is reduced to $5\times10^{15}$ cm$^{-3}$ or less, preferably to $1\times10^{15}$ cm$^{-3}$ or less; the K concentration is reduced to $5\times10^{15}$ cm$^{-3}$ or less, preferably to $1\times10^{15}$ cm$^{-3}$ or less. Note that the Na concentration, the Li concentration, and the K concentration in the oxide semiconductor layer 144 are measured by secondary ion mass spectrometry (SIMS).

An alkali metal and an alkaline earth metal are adverse impurities for the oxide semiconductor and are preferably contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to reduce to the above degree in the case where the concentration of hydrogen contained in the oxide semiconductor is lower than or equal to $5\times10^{19}$ cm$^{-3}$, particularly lower than or equal to $5\times10^{18}$ cm$^{-3}$.

Figure 11B:
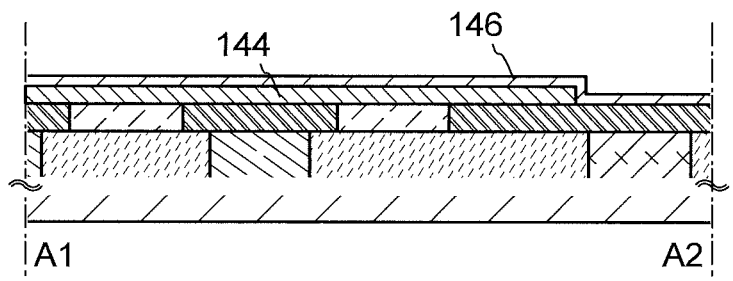

The oxide semiconductor layer 144 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. A pulsed direct current (DC) power source is preferably used because dust (powdery substance generated at the time of film formation) can be reduced and the film thickness becomes even. The thickness of the oxide semiconductor layer 144 is, as described above, greater than or equal to 1 nm and less than or equal to 50 nm, preferably greater than or equal to 2 nm and less than or equal to 20 nm, further preferably greater than or equal to 3 nm and less than or equal to 15 nm. With a structure according to one embodiment of the present invention, generation of a short-channel effect due to miniaturization can be suppressed even in the case of using the oxide semiconductor layer 144 having such a thickness. Note that an appropriate film thickness differs depending on an oxide semiconductor material, the usage of a semiconductor device, or the like; therefore, it is also possible to set the film thickness as appropriate depending on the material, the usage, or the like. The insulating layer 140 is formed in the above manner, a surface of a portion where the channel formation region is to be formed in the oxide semiconductor layer 144 can be sufficiently planarized; thus, the oxide semiconductor layer can be suitably formed even when having a small thickness. As illustrated in FIG. 11B, the portion corresponding to the channel formation region in the oxide semiconductor layer 144 preferably has a planar cross-sectional shape. By making the cross-sectional shape of the portion corresponding to the channel formation region of the oxide semiconductor layer 144 plane, leakage current can be reduced as compared to the case where the cross-sectional shape of the oxide semiconductor layer 144 is not plane.

Before the oxide semiconductor layer 144 is formed by a sputtering method, reverse sputtering in which plasma is generated with an argon gas introduced may be performed so that a substance attached to a surface where the oxide semiconductor layer 144 is to be formed (e.g., the surface of the insulating layer 140) is removed. The reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface in an argon atmosphere so that plasma is generated in the vicinity of the object to be processed. An atmosphere of nitrogen, helium, oxygen, or the like may be used instead of an argon atmosphere.

After the oxide semiconductor layer 144 is formed, heat treatment (first heat treatment) is preferably performed on the oxide semiconductor layer 144. Through the first heat treatment, excess hydrogen (including water or a hydroxyl group) in the oxide semiconductor layer 144 can be removed, so that the structure of the oxide semiconductor layer 144 can be ordered to reduce defect levels in an energy gap. The temperature of the first heat treatment is, for example, higher than or equal to 300° C. and lower than 550° C., preferably higher than or equal to 400° C. and lower than or equal to 500° C.

The heat treatment can be performed in such a way that, for example, an object to be heated is introduced into an electric furnace in which a resistance heating element or the like is used and heated, under a nitrogen atmosphere at 450° C. for one hour. In the heat treatment, the oxide semiconductor layer is not exposed to the air to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA treatment may be performed as follows: the object is put in an inert gas atmosphere that has been heated, heated for several minutes, and taken out from the inert gas atmosphere. The GRTA treatment enables high-temperature heat treatment for a short time. Moreover, the GRTA treatment can be employed even when the temperature exceeds the upper temperature limit of the object. The inert gas may be switched to a gas including oxygen during the treatment. This is because defect levels in energy gap due to oxygen deficiency can be reduced by performing the first heat treatment in an atmosphere including oxygen.

As the inert gas atmosphere, an atmosphere that contains nitrogen or a rare gas (e.g., helium, neon, or argon) as its main component and does not contain water, hydrogen, or the like is preferably used. For example, the purity of nitrogen or the rare gas such as helium, neon, or argon introduced into the heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, impurities are reduced by the first heat treatment and oxygen is supplied to compensate the oxygen deficiency, so that the i-type (intrinsic) or substantially i-type oxide semiconductor layer is obtained; accordingly, a transistor having highly excellent characteristics can be achieved.

The above heat treatment (first heat treatment) can be referred to as dehydration treatment, dehydrogenation treatment, or the like because of its effect of removing hydrogen, water, and the like. The dehydration treatment or the dehydrogenation treatment can also be performed at the following timing: after the formation of the oxide semiconductor layer 144, after the formation of the gate insulating layer 146, after the formation of the gate electrode, or the like. Such dehydration treatment or dehydrogenation treatment may be conducted plural times.

The etching of the oxide semiconductor layer 144 may be performed before or after the heat treatment. In view of miniaturization of an element, dry etching is preferably used; however, wet etching may be used. An etching gas and an etchant can be selected as appropriate depending on a material of the layer to be etched. In the case where there is no need for consideration of leakage current in an element, the oxide semiconductor layer may be used without being processed to have an island shape.

Oxide conductive layers serving as a source region and a drain region may be provided as buffer layers between the oxide semiconductor layer 144 and the source electrode layer 142a and between the oxide semiconductor layer 144 and the drain electrode layer 142b.

As the formation method of the oxide conductive layer, a sputtering method, a vacuum evaporation method (an electron beam evaporation method or the like), an arc discharge ion plating method, or a spray method can be used. As a material of the oxide conductive layer, zinc oxide, zinc aluminum oxide, zinc aluminum oxynitride, zinc gallium oxide, indium tin oxide, or the like can be used. The thickness of the oxide conductive layer is set as appropriate to a thickness greater than or equal to 50 nm and less than or equal to 300 nm. In addition, the above material may include silicon oxide.

The oxide conductive layer can be processed into the shape by the same photolithography step for forming the source electrode 142a and the drain electrode 142b. The oxide conductive layer can be processed into the shape with the same mask by the same photolithography step for forming the oxide semiconductor layer 144.

With the oxide conductive layers provided as the source region and the drain region between the oxide semiconductor layer 144 and the source electrode layer 142a and between the oxide semiconductor layer 144 and the drain electrode layer 142b, the resistance of the source region and the drain region can be reduced, which enables the second transistor 162 to operate at high speed.

Further, with the structure including the oxide semiconductor layer 144, the oxide conductive layer, and the drain electrode layer 142b, withstand voltage of the second transistor 162 can be improved.

It is effective to use the oxide conductive layers as a source region and a drain region in order to improve frequency characteristics of a peripheral circuit (a driver circuit). This is because the contact resistance can be reduced in the contact between a metal electrode (e.g., molybdenum or tungsten) and an oxide conductive layer, as compared to the contact between the metal electrode (e.g., molybdenum or tungsten) and an oxide semiconductor layer. The contact resistance can be reduced by providing an oxide conductive layer between the oxide semiconductor layer and the source and drain electrode layers; thus, frequency characteristics of a peripheral circuit (driver circuit) can be improved.

Next, the gate insulating layer 146 is formed so as to cover the oxide semiconductor layer 144 (see FIG. 11B).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0) to which nitrogen is added, hafnium aluminate (HfAl$_x$O$_y$ (x>0, y>0) to which nitrogen is added, or the like. The gate insulating layer 146 may have a single-layer structure or a stacked-layer structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like occurs. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, electrical characteristics can be ensured and the thickness can be increased to prevent gate leakage. For example, the relative permittivity of hafnium oxide is about 15, which is much higher than that of silicon oxide which is 3 to 4. With such a material, a gate insulating layer which corresponds to a thickness of silicon oxide of less than 15 nm, preferably greater than or equal to 2 nm and less than or equal to 10 nm, can be easily formed. A stacked-layer structure of a film containing a high-k material and a film containing any one of silicon oxide, silicon nitride, silicon oxynitride, silicon nitride oxide, aluminum oxide, and the like may be employed.

Further, a film which is in contact with the oxide semiconductor layer 144, such as the gate insulating layer 146, is preferably an oxide film, a nitride film, or a metal oxide film; for example, silicon oxide, silicon nitride, silicon oxynitride, silicon nitride oxide, or the like is used as an example thereof. Alternatively or in addition, a material including a Group 13 element and oxygen can be used. For example, as the material including an element of Group 13 and oxygen, a material including one or more of gallium oxide, aluminum oxide, aluminum gallium oxide, and gallium aluminum oxide is given. Aluminum gallium oxide refers to a material in which the amount of aluminum is greater than that of gallium in atomic percent, and gallium aluminum oxide refers to a material in which the amount of gallium is greater than or equal to that of aluminum in atomic percent. The metal oxide film can be formed with a single-layer structure or a stacked-layer structure using any of the above-described materials.

After the gate insulating layer 146 is formed, it is preferable to perform second heat treatment in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, heat treatment may be performed at 250° C. for 1 hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to compensate oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is applied, whereby the oxide semiconductor layer 144 can be highly purified as to contain the amount of impurities that are not main components of the oxide semiconductor layer 144.

Next, the gate electrode 148 is formed over the gate insulating layer 146.

The gate electrode 148 can be formed in such a manner that a conductive layer is formed over the gate insulating layer 146 and then selectively etched. The conductive layer to be the gate electrode 148 can be formed by a PVD method such as a sputtering method or a CVD method such as a plasma CVD method. The details thereof are similar to those in the case of the source electrode 142a and the drain electrode 142b, or the like; thus, the description thereof can be referred to.

Figure 11C:
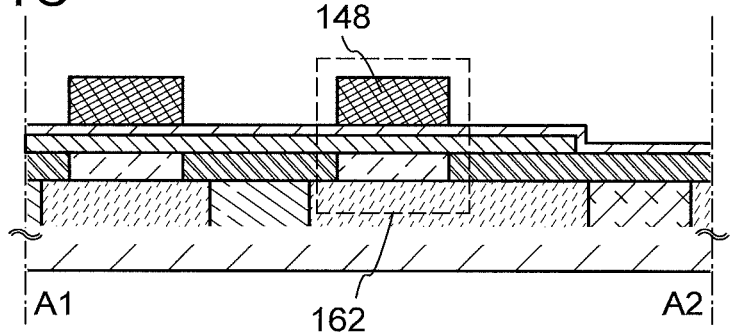

Through the above, the second transistor 162 using the oxide semiconductor layer 144 which has been highly purified and whose oxygen deficiency has been compensated by supplying oxygen is completed (see FIG. 11C). The second transistor 162 thus formed features in that the off-state current has been sufficiently reduced. Therefore, with the use of the transistor as a writing transistor, charge can be retained for a long time.

Figure 11D:
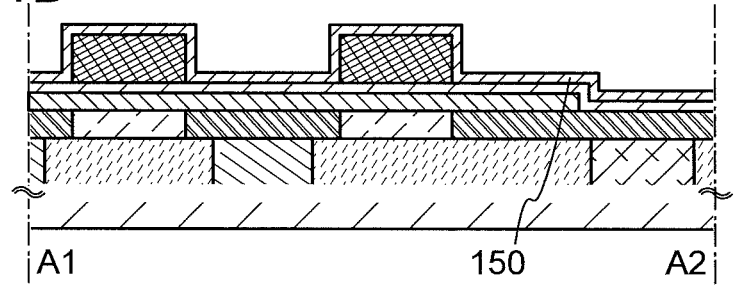

Next, the insulating layer 150 is formed over the gate insulating layer 146 and the gate electrode 148 (see FIG. 11D). The insulating layer 150 can be formed by a PVD method, a CVD method, or the like. The insulating layer 150 can be formed so as to have a single-layer structure or a stacked-layer structure using a material including an inorganic insulating material such as silicon oxide, silicon oxynitride, silicon nitride, hafnium oxide, or aluminum oxide.

Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings or electrodes can be reduced, which increases operation speed.

Figure 12A:
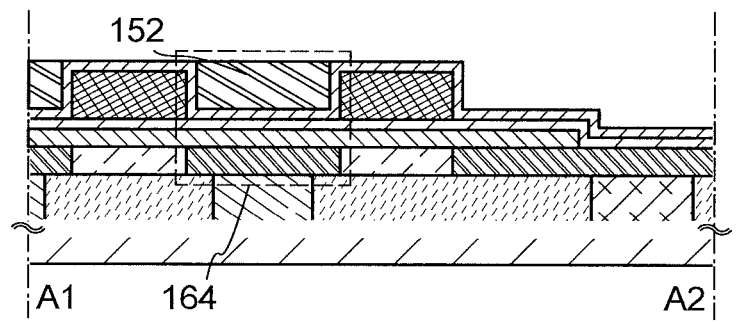
FIGS. 12A to 12C are cross-sectional views for describing a manufacturing process of a semiconductor device.
Figure 12B:
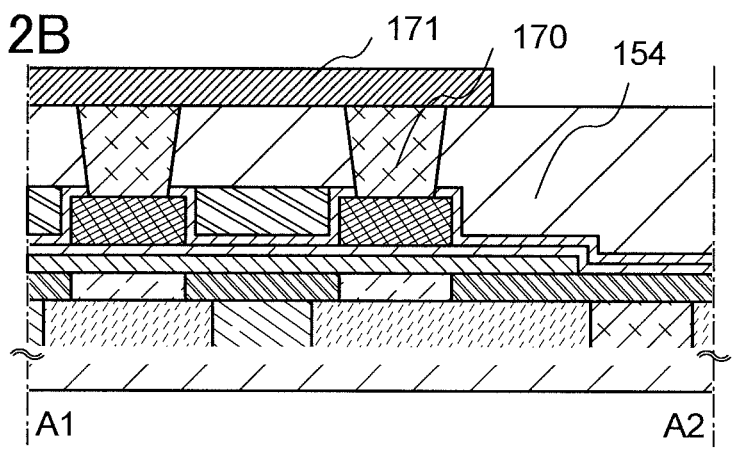
Figure 12C:
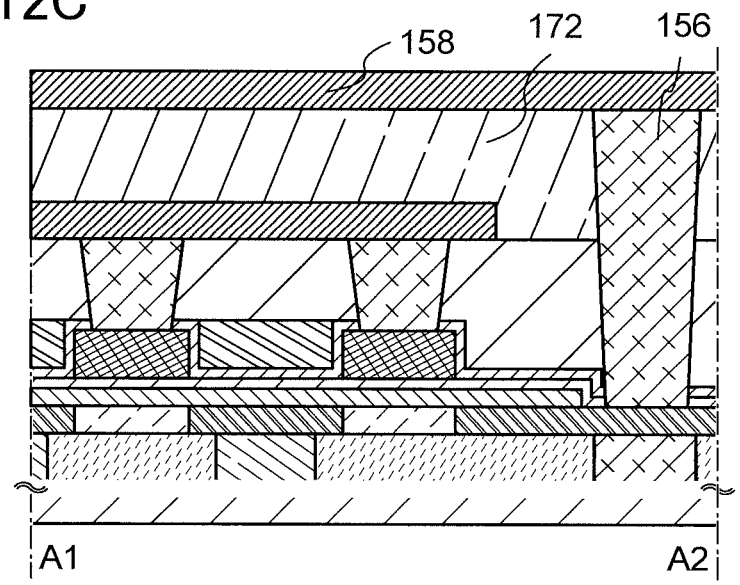

Next, the electrode 152 is formed over the insulating layer 150 so as to overlap with the source electrode 142a (see FIG. 12A). The method and material for forming the gate electrode 148 can be applied to the electrode 152; therefore, the description of the gate electrode 148 can be referred to for the details of the electrode 152. Through the above process, the capacitor 164 is formed.

Next, the insulating layer 154 is formed over the insulating layer 150 and the electrode 152. The opening reaching the gate electrode 148 is formed in the insulating layers 150 and 154, the electrode 170 is formed in the opening, and the wiring 171 which is in contact with the electrode 170 is formed over the insulating layer 154 (see FIG. 12B). The opening is formed by selective etching with the use of a mask or the like.

Next, the insulating layer 172 is formed over the electrode 152 and the wiring 171. Next, the opening reaching the drain electrode 142b is formed in the gate insulating layer 146 and the insulating layers 150, 154, and 172, the electrode 156 is formed in the opening, and the wiring 158 which is in contact with the electrode 156 is formed over the insulating layer 172 (see FIG. 12C). The opening is formed by selective etching with the use of a mask or the like.

The insulating layers 154 and 172 can be formed in a similar manner to the insulating layer 150 by a PCVD method, a CVD method, or the like. Any of the insulating layers 154 and 170 can be formed so as to have a single-layer structure or a stacked-layer structure using a material including an inorganic insulating material such as silicon oxide, silicon oxynitride, silicon nitride, hafnium oxide, or aluminum oxide.

Note that for any of the insulating layers 154 and 172, a material with a low dielectric constant may be preferably used or a structure with a low dielectric constant (e.g., a porous structure) may be preferably employed. This is because by reducing the dielectric constant of the insulating layer 154, 172, capacitance between wirings or electrodes can be reduced, which increases operation speed.

Note that the insulating layer 154 and the insulating layer 172 are preferably formed so as to have planar surfaces. By forming the insulating layers 154 and 172 having planar surfaces, an electrode, a wiring, or the like can be appropriately formed over the insulating layers 154 and 172 even in the case where the semiconductor device is miniaturized, for example. The insulating layers 154 and 172 can be planarized by a method such as chemical mechanical polishing (CMP).

Any of the electrode 170 and the electrode 156 can be formed in such a manner, for example, that a conductive layer is formed in a region including the opening by a PVD method, a CVD method, or the like and then part of the conductive layer is removed by etching, CMP, or the like.

Specifically, it is possible to employ a method, for example, in which a thin titanium film is formed in a region including the opening by a PVD method and a thin titanium nitride film is formed by a CVD method, and then, a tungsten film is formed so as to fulfill the openings. The titanium film formed by a PVD method has a function of reducing an oxide film (such as a natural oxide film) on which the titanium film is formed, and thereby reducing contact resistance with a lower electrode or the like (the drain electrode 142b, in this embodiment). The titanium nitride film formed after the formation of the titanium film has a barrier function of preventing diffusion of the conductive material. A copper film may be formed by a plating method after the formation of the barrier film of titanium, titanium nitride, or the like.

Any of the wirings 171 and 158 is formed in such a manner that a conductive layer is formed by a PVD method such as a sputtering method or a CVD method such as a plasma CVD method and then is etched into a desired shape. As a material for the conductive layer, an element selected from aluminum, chromium, copper, tantalum, titanium, molybdenum, and tungsten; an alloy containing any of these elements as a component; or the like can be used. Alternatively or in addition, one or more materials selected from manganese, magnesium, zirconium, beryllium, neodymium, and scandium may be used. The details thereof are similar to those of the source electrode 142a or the like.

Note that a variety of wirings, electrodes, or the like may be formed after the above process. The wirings or the electrodes can be formed by a method such as a so-called damascene method or a dual damascene method.

Through the above process, the semiconductor device with the structure illustrated in FIGS. 8A and 8B can be manufactured.

In the second transistor 162 described in this embodiment, the oxide semiconductor layer 144 is highly purified and thus contains hydrogen at a concentration of $5 \times 10^{19}$ atoms/cm$^3$ or less, preferably $5 \times 10^{18}$ atoms/cm$^3$ or less, further preferably $5 \times 10^{17}$ atoms/cm$^3$ or less. In addition, the carrier density of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (about $1 \times 10^{14}$/cm$^3$). In addition, the off-state current of the second transistor 162 is sufficiently low. For example, the off-state current (per unit channel width (1 μm), in this embodiment) of the second transistor 162 at room temperature (25° C.) is 100 zA (1 zA (zeptoampere) is $1 \times 10^{-21}$ A) or less, preferably 10 zA or less.

In this manner, with the oxide semiconductor layer 144 which has been highly purified and is intrinsic, the off-state current of the second transistor 162 can be easily sufficiently reduced. Further, with the second transistor 162, a semiconductor device capable of retaining stored data for an extremely long time can be provided.

The structures, methods, and the like described in this embodiment can be combined as appropriate with any of the structures, methods, and the like described in the other embodiments.

(Embodiment 5)

In this embodiment, an example of a transistor that can be applied to a semiconductor device described in this description will be described. There is no particular limitation on the structure of the transistor that can be applied to a semiconductor device described in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel region with a gate insulating layer provided therebetween.

FIGS. 13A to 13D each illustrate an example of a cross-sectional structure of a transistor that can be applied to a semiconductor device described in this description (for example, the second transistor 202 in Embodiment 1). In each of FIGS. 13A to 13D, the transistor is provided over an insulating layer 400; however, the transistor may be provided over a substrate such as a glass substrate. In the case where any of the transistors illustrated in FIGS. 13A to 13D is applied to the second transistor 162 in Embodiment 4, the insulating layer 400 corresponds to the insulating layer 128.

Figure 13A:
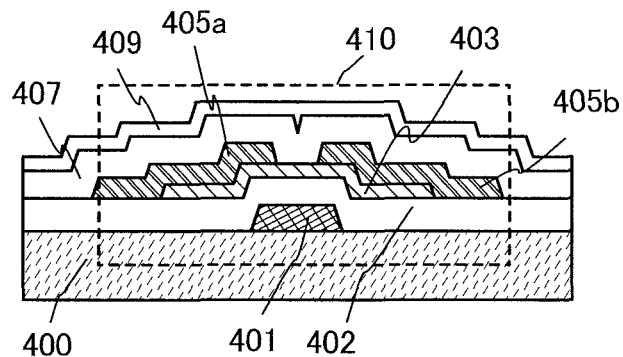
FIGS. 13A to 13D are cross-sectional views of semiconductor devices.

A transistor 410 illustrated in FIG. 13A is one of bottom gate thin film transistors and is also called an inverted staggered thin film transistor.

The transistor 410 includes, over the insulating layer 400, a gate electrode layer 401, a gate insulating layer 402, an oxide semiconductor layer 403, a source electrode layer 405a, and a drain electrode layer 405b. Further, an insulating layer 407 stacked over the oxide semiconductor layer 403 is provided so as to cover the transistor 410. An insulating layer 409 is provided over the insulating layer 407.

Figure 13B:
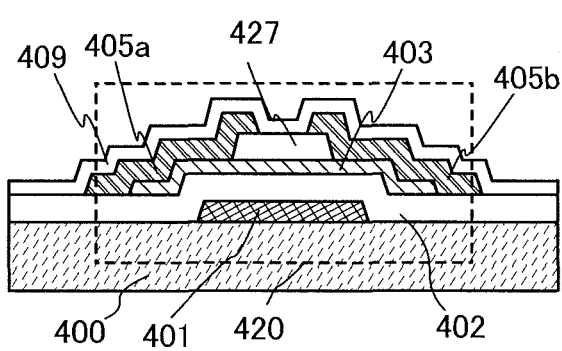

A transistor 420 illustrated in FIG. 13B is a bottom gate transistor referred to as a channel-protective type (also referred to as a channel-stop type) transistor and is also referred to as an inverted staggered thin film transistor.

The transistor 420 includes, over the insulating layer 400, the gate electrode layer 401, the gate insulating layer 402, the oxide semiconductor layer 403, an insulating layer 427 functioning as a channel protective layer which covers a channel formation region of the oxide semiconductor layer 403, the source electrode layer 405a, and the drain electrode layer 405b. The insulating layer 409 is formed to cover the transistor 420.

Figure 13C:
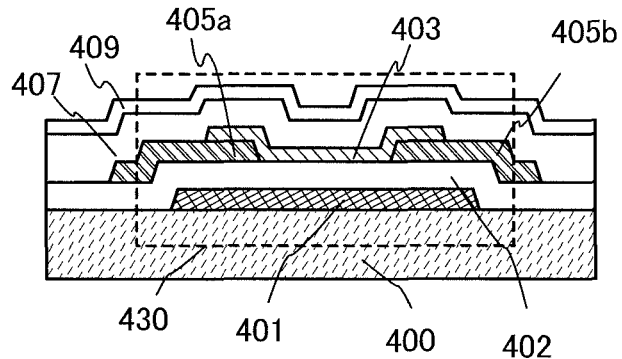

A transistor 430 illustrated in FIG. 13C is a bottom gate thin film transistor and includes, over the insulating layer 400 that is a substrate having an insulating surface, the gate electrode layer 401, the gate insulating layer 402, the source electrode layer 405a, the drain electrode layer 405b, and the oxide semiconductor layer 403. Further, the insulating layer 407 being in contact with the oxide semiconductor layer 403 is provided so as to cover the transistor 430. The insulating layer 409 is provided over the insulating layer 407.

In the transistor 430, the gate insulating layer 402 is provided on and in contact with the insulating layer 400 and the gate electrode layer 401, and the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 13D:
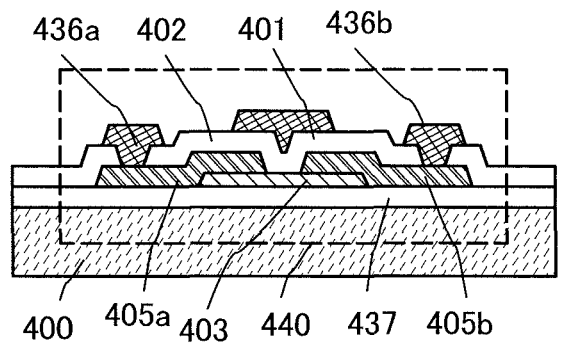

A transistor 440 illustrated in FIG. 13D is one of top gate thin film transistors.

The transistor 440 includes, over the insulating layer 400, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are provided in contact with and electrically connected to the source electrode layer 405a and the drain electrode layer 405b respectively.

In the case of providing any of the bottom gate transistors 410, 420, and 430 over a substrate, an insulating film serving as a base film may be provided between the substrate and the gate electrode layer. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The gate electrode layer 401 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a stacked-layer structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer (SiN$_y$ (y>0)) with a thickness of greater than or equal to 50 nm and less than or equal to 200 nm is formed as a first gate insulating layer, and a silicon oxide layer (SiO$_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As the conductive film used for the source electrode layer 405a and the drain electrode layer 405b, for example, a film of an element selected from Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Ti, Mo, W, or the like is stacked over and/or below a metal layer of Al, Cu, or the like. With an Al material to which an element (e.g., Si, Nd, or Sc) which prevents generation of hillocks or whiskers in an Al film is added, heat resistance can be increased.

A material similar to that for the source electrode layer 405a and the drain electrode layer 405b can be used for a conductive film used for the wiring layer 436a and the wiring layer 436b which are respectively connected to the source electrode layer 405a and the drain electrode layer 405b.

Alternatively, the conductive film to be the source and drain electrode layers 405a and 405b (including any wiring layer formed using the same layer as the source and drain electrode layers) may be formed using conductive metal oxide. As the conductive metal oxide, indium oxide (In$_2$O$_3$), tin oxide (SnO$_2$), zinc oxide (ZnO), indium oxide-tin oxide alloy (In$_2$O$_3$—SaO$_2$; abbreviated to ITO), indium oxide-zinc oxide alloy (In$_2$O$_3$—ZnO), or any of these metal oxide materials in which silicon or silicon oxide is contained can be used.

As the insulating layer 407, 427, 437, an inorganic insulating film, typical examples of which are a silicon oxide film, a silicon oxynitride film, an aluminum oxide film, and an aluminum oxynitride film, can be used.

As the insulating layer 409, an inorganic insulating film such as a silicon nitride film, an aluminum nitride film, a silicon nitride oxide film, or an aluminum nitride oxide film can be used.

In addition, a planarization insulating film may be formed over the insulating layer 409 in order to reduce surface roughness due to the transistor. As the planarization insulating film, an organic material such as polyimide, an acrylic resin, and a benzocyclobutene-based resin can be used. Other than such organic materials, it is also possible to use a low-dielectric constant material (a low-k material) or the like. The planarization insulating film may be formed by stacking a plurality of insulating films formed using any of those materials.

Figure 14A:
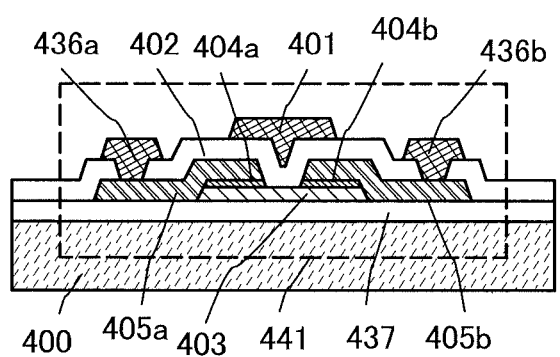
FIGS. 14A and 14B are cross-sectional views of semiconductor devices.
Figure 14B:
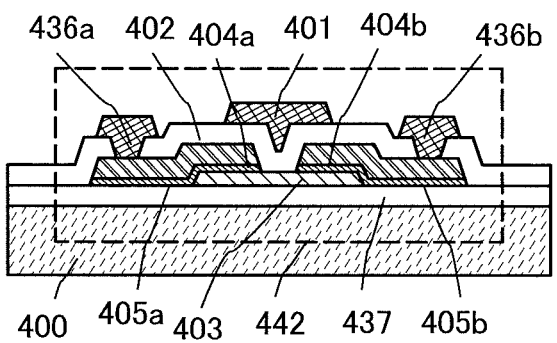

Oxide conductive layers functioning as a source region and a drain region may be provided between the oxide semiconductor layer 403 and the source electrode layer 405a and between the oxide semiconductor layer 403 and the drain electrode layer 405b, as buffer layers. FIGS. 14A and 14B illustrate a transistor 441 and a transistor 442, respectively, where oxide conductive layers are provided in the transistor 440 in FIG. 13D.

In each of the transistors 441 and 442 in FIGS. 14A and 14B, oxide conductive layers 404a and 404b serving as a source region and a drain region are provided between the oxide semiconductor layer 403 and the source electrode layer 405a and between the oxide semiconductor layer 403 and the drain electrode layer 405b. The transistors 441 and 442 of FIGS. 14A and 14B are examples where the shapes of the oxide conductive layers 404a and 404b can be changed depending on the manufacturing process.

As for the transistor 441 illustrated in FIG. 14A, a stack of an oxide semiconductor film and an oxide conductive film is formed and the shape of the stack is processed to film the island-shaped oxide semiconductor layer 403 and the island-shaped oxide conductive film by the same photolithography step. The source electrode layer 405a and the drain electrode layer 405b are formed over the oxide semiconductor layer and the oxide conductive film. After that, the island-shaped oxide conductive film is etched with the use of the source electrode layer 405a and the drain electrode layer 405b as masks to form the oxide semiconductor conductive layers 404a and 404b serving as a source region and a drain region.

As for the transistor 442 illustrated in FIG. 14B, an oxide conductive film is formed over the oxide semiconductor layer 403, a metal conductive film is formed over the oxide conductive film, and the oxide conductive film and the metal conductive film are processed by the same photolithography step; thus, the oxide conductive layer 404a and the oxide conductive layer 404b which serve as a source region and a drain region, the source electrode layer 405a, and the drain electrode layer 405b are formed.

For the etching for processing the shape of the oxide conductive layer, the etching conditions (e.g., the kind and concentration of etchant, and etching time) are adjusted as appropriate to prevent overetching of the oxide semiconductor layer.

As a method for forming the oxide conductive layer 404a, 404b, a sputtering method, a vacuum evaporation method (such as an electron beam evaporation method), an arc discharge ion plating method, or a spray method is used. As a material of the oxide conductive layer, zinc oxide, zinc aluminum oxide, zinc aluminum oxynitride, zinc gallium oxide, or the like can be used. In addition, the above material may include silicon oxide.

With the oxide conductive layers provided as the source region and the drain region between the oxide semiconductor layer 403 and the source electrode layer 405a and between the oxide semiconductor layer 403 and the drain electrode layer 405b, the resistance of the source region and the drain region can be reduced, which leads to high-speed operation of and the transistors 441 and 442.

With the structure including the oxide semiconductor layer 403, the oxide conductive layers 404a and 404b, and the drain electrode layer 405b, withstand voltages of the transistors 441 and 442 can be improved.

This embodiment can be combined as appropriate with any of the structures described in the other embodiments.

(Embodiment 6)

Figure 15A:
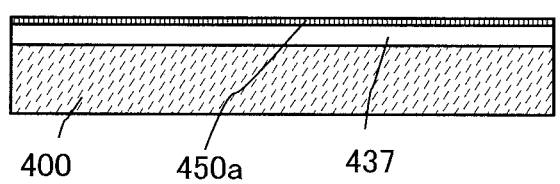
FIGS. 15A to 15C are cross-sectional views for describing a manufacturing process of a semiconductor device.
Figure 15B:
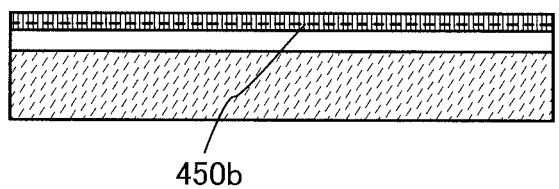

One embodiment of an oxide semiconductor layer that can be used for the semiconductor layer of the transistor in any of Embodiments 1 to 5 will be described with reference to FIGS. 15A to 15C.

The oxide semiconductor layer of this embodiment has a stacked-layer structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 400. In this embodiment, an oxide insulating layer with a thickness greater than or equal to 50 nm and less than or equal to 600 nm is formed as the insulating layer 437 by a PCVD method or a sputtering method. For example, a single layer or a plurality of layers selected from a silicon oxide film, a gallium oxide film, an aluminum oxide film, a silicon oxynitride film, an aluminum oxynitride film, and a silicon nitride oxide film can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by the sputtering method is set to be higher than or equal to 200° C. and lower than or equal to 400° C.

In this embodiment, the first oxide semiconductor film is formed to a thickness of 5 nm in an oxygen atmosphere, an argon atmosphere, or a mixed atmosphere of argon and oxygen under conditions that a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 15A).

Depending on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the amount of oxygen in the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed on and in contact with the surface of the first crystalline oxide semiconductor layer and so-called orderliness can be provided.

In this embodiment, the second oxide semiconductor film is deposited to a thickness of 25 nm in an oxygen atmosphere, an argon atmosphere, or an atmosphere including argon and oxygen under conditions where a target for a metal oxide semiconductor (a target for an In—Ga—Zn—O-based metal oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Then, a second heat treatment is performed by setting an atmosphere in a chamber where the substrate is placed to a nitrogen atmosphere or dry air. The temperature of the second heat treatment is higher than or equal to 400° C. and lower than or equal to 750° C. Through the second heat treatment, a second crystalline oxide semiconductor layer 450b is formed (see FIG. 15B). The second heat treatment is performed in a nitrogen atmosphere, an oxygen atmosphere, or a mixed atmosphere of argon and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that process from and including the formation of the insulating layer 437 to and including the second heat treatment be successively performed without exposure to the air. The process from and including the formation of the insulating layer 437 to and including the second heat treatment is preferably performed in an atmosphere which is controlled to include hydrogen and moisture as less as possible (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 15C:
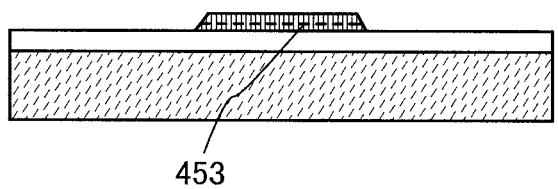

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 15C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface thereof is actually not clear and is illustrated here for easy understanding.

The stack of the oxide semiconductor layers can be processed by etching after a mask having a desired shape is formed over the stack of the oxide semiconductor layers. The mask may be formed by photolithography, an ink-jet method, or the like.

For the etching of the stack of the oxide semiconductor layers, either wet etching or dry etching may be employed. It is needless to say that both of them may be employed in combination.

A feature of the first crystalline oxide semiconductor layer and the second crystalline oxide semiconductor layer obtained by the above formation method is that they have c-axis alignment. The first crystalline oxide semiconductor layer and the second crystalline oxide semiconductor layer are neither single crystal nor amorphous but are crystalline oxide semiconductors having c-axis alignment (also referred to as c-axis aligned crystalline (CAAC) oxide semiconductors). The first crystalline oxide semiconductor layer and the second crystalline oxide semiconductor layer partly include a crystal grain boundary.

The first crystalline oxide semiconductor layer and the second crystalline oxide semiconductor layer are each formed using an oxide material including at least Zn. For example, an oxide of four metal elements, such as an In—Al—Ga—Zn—O-based material, or an In—Sn—Ga—Zn—O-based material; an oxide of three metal elements, such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; an oxide of two metal elements, such as an In—Zn—O-based material, a Sn—Zn—O-based material, an Al—Zn—O-based material, or a Zn—Mg—O-based material; a Zn—O-based material; or the like can be used. An In—Si—Ga—Zn—O-based based material, an In—Ga—B—Zn—O-based material, or an In—B—Zn—O-based material may be used as well. In addition, the above material may include $SiO_2$. Here, for example, the In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn.

Without limitation to the two-layer structure in which the second crystalline oxide semiconductor layer is formed over the first crystalline oxide semiconductor layer, a stacked structure including three or more layers may be formed by further performing a film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the second transistor 202 in Embodiment 1, the second transistor 212 in Embodiment 2, the second transistor 312 in Embodiment 3) which can be applied to a driving method of a semiconductor device described in this description.

Further, an electric field is not applied from one surface of the oxide semiconductor layer to the other surface thereof, and current does not flow in the thickness direction of the stack of oxide semiconductor layers (in the direction from the one surface to the other surface, specifically, in the longitudinal direction of FIG. 15C). The transistor has a structure in which current mainly flows in the interface of the stack of the oxide semiconductor layers; therefore, even when the transistor is irradiated with light or even when a BT stress is applied to the transistor, deterioration of transistor characteristics is suppressed or reduced.

With the use of the stack of a first crystalline oxide semiconductor layer and a second crystalline oxide semiconductor layer, like the oxide semiconductor layer 453, the transistor can have stable electric characteristics and high reliability.

This embodiment can be combined as appropriate with any of the structures described in the other embodiments.

(Embodiment 7)

In this embodiment, the case where the semiconductor device described in any of the above embodiments is applied to an electronic device will be described with reference to FIGS. 16A to 16F. In this embodiment, the case where the driving method of the semiconductor device is applied to electronic devices is applied to electronic devices such as a personal computer, a mobile phone set (also referred to as a mobile phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 16A:
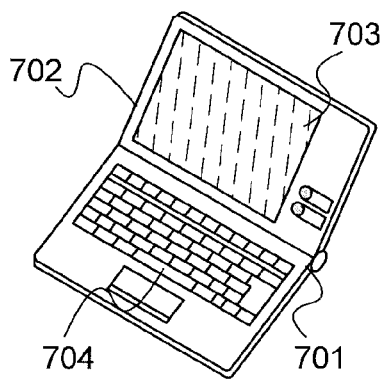
FIGS. 16A to 16F are views illustrating electronic devices each including a semiconductor device.

FIG. 16A illustrates a laptop computer including a housing 701, a housing 702, a display portion 703, a keyboard 704, and the like. The driving method of the semiconductor device described in any of the above embodiments is provided for at least one of the housing 701 and the housing 702. Accordingly, a laptop computer capable of data retention for a long time, with high-speed data writing and reading, and with high reliability for data writing and reading can be realized.

Figure 16D:
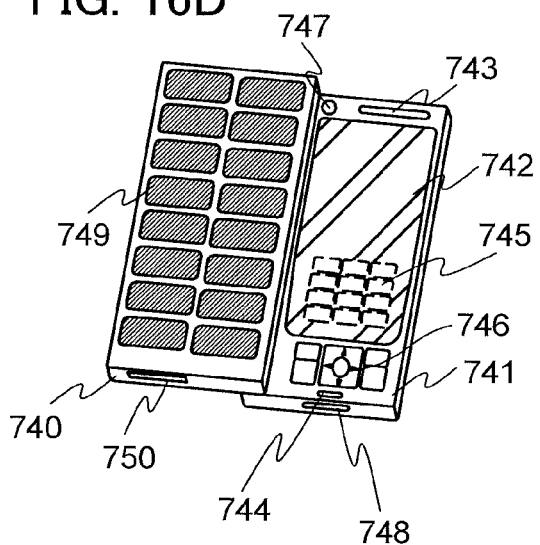
Figure 16B:
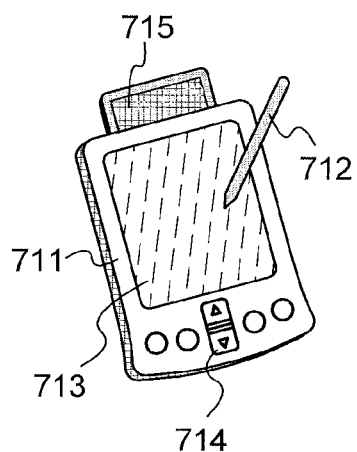

FIG. 16B illustrates a portable information terminal (personal digital assistant (PDA)). A main body 711 is provided with a display portion 713, an external interface 715, operation buttons 714, and the like. Further, a stylus 712 and the like for operation of the portable information terminal are provided. The driving method of the semiconductor device described in any of the above embodiments is provided for the main body 711. Accordingly, a portable information terminal capable of data retention for a long time, with high-speed data writing and reading, and with high reliability for data writing and reading can be realized.

Figure 16E:
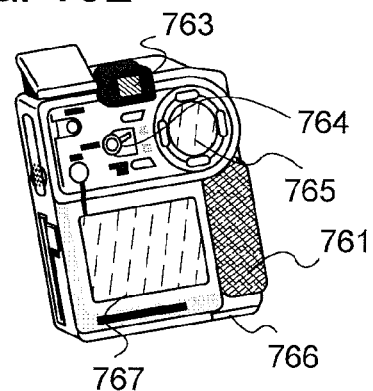
Figure 16C:
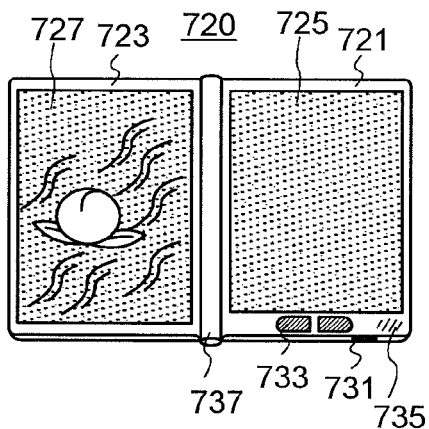

FIG. 16C illustrates an e-book reader 720 mounted with an electronic paper, which includes two housings, a housing 721 and a housing 723. The housing 721 and the housing 723 are provided with a display portion 725 and a display portion 727, respectively. The housings 721 and 723 are connected by a hinge 737 and can be opened or closed with the hinge 737. The housing 721 is provided with a power supply 731, an operation key 733, a speaker 735, and the like. The driving method of the semiconductor device described in any of the above embodiments is provided for at least one of the housings 721 and 723. Accordingly, an e-book reader capable of data retention for a long time, with high-speed data writing and reading, and with high reliability for data writing and reading can be realized.

FIG. 16D illustrates a mobile phone including two housings, a housing 740 and a housing 741. Further, the housing 740 and the housing 741 can be slide out as shown in FIG. 16D, and overlapped with each other to be suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. In addition, an antenna is incorporated in the housing 741. The driving method of the semiconductor device described in any of the above embodiments is provided for at least one of the housings 740 and 741. Accordingly, a mobile phone capable of data retention for a long time, with high-speed data writing and reading, and with high reliability for data writing and reading can be realized.

FIG. 16E illustrates a digital video camera including a main body 761, a display portion 767, an eyepiece portion 763, an operation switch 764, a display portion 765, a battery 766, and the like. The driving method of the semiconductor device described in any of the above embodiments is provided for the main body 761. Accordingly, a digital video camera capable of data retention for a long time, with high-speed data writing and reading, and with high reliability for data writing and reading can be realized.

Figure 16F:
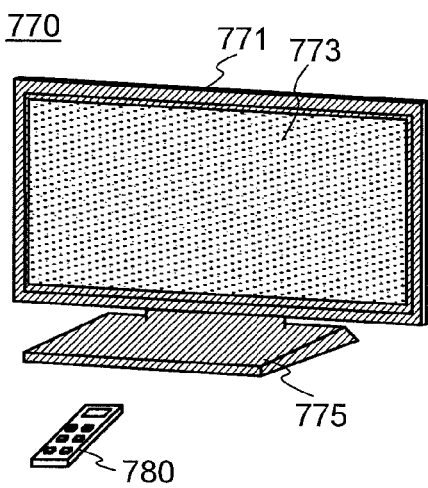

FIG. 16F illustrates a television set 770 which includes a housing 771, a display portion 773, a stand 775, and the like. The television set 770 can be operated with a switch of the housing 771 or a remote controller 780. The driving method of the semiconductor device described in any of the above embodiments is provided for the housing 771 and the remote controller 780. Accordingly, a television set capable of data retention for a long time, with high-speed data writing and reading, and with high reliability for data writing and reading can be realized.

As described above, any electronic device described in this embodiment is provided with the driving method of the semiconductor device described in any of the above embodiments. Accordingly, an electronic device capable of data retention for a long time, with high-speed data writing and reading, and with high reliability for data writing and reading can be realized.

This application is based on Japanese Patent Application serial no. 2010-194501 filed with Japan Patent Office on Aug. 31, 2010, the entire contents of which are hereby incorporated by reference.

What is claimed is:

1. A driving method of a semiconductor device, the semiconductor device comprising:
    a memory element comprising a first transistor, a capacitor, and a second transistor;
    a first word line electrically connected to a gate terminal of the first transistor;
    a first bit line electrically connected to a source terminal of the first transistor;
    a source line electrically connected to a drain terminal of the first transistor;
    a second word line electrically connected to a gate terminal of the second transistor; and
    a second bit line electrically connected to a source terminal of the second transistor,
    wherein the gate terminal of the first transistor is electrically connected to a drain terminal of the second transistor, and
    wherein the capacitor is electrically connected to the gate terminal of the first transistor and the first word line,
    the driving method comprising the steps of:
    supplying a potential to the second word line to turn on the second transistor;
    supplying a potential to the first bit line step-by-step to supply an electrical charge to the gate terminal of the first transistor, while reading a current which flows into the first transistor; and
    stopping supplying the potential step-by-step to the first bit line when the current which flows into the first transistor reaches a given value, so that data writing is performed.

2. The driving method of a semiconductor device according to claim 1,
    wherein the memory element is arranged in a matrix of m rows (in the horizontal direction) by n columns (in the longitudinal direction) (m and n are natural numbers greater than or equal to 1), and
    wherein the data writing is performed per row sequentially from the first row.

3. The driving method of a semiconductor device according to claim 1,
    wherein the given value can be set to three or more values.

4. The driving method of a semiconductor device according to claim 1, wherein the first transistor comprises a semiconductor material.

5. The driving method of a semiconductor device according to claim 4, wherein the semiconductor material is a single crystalline semiconductor material.

6. The driving method of a semiconductor device according to claim 4, wherein the semiconductor material is silicon.

7. The driving method of a semiconductor device according to claim 1, wherein the second transistor comprises an oxide semiconductor layer.

8. The driving method of a semiconductor device according to claim 7, wherein the oxide semiconductor layer comprises In, Ga, and Zn.

9. The driving method of a semiconductor device according to claim 1, wherein the semiconductor device is one of a laptop personal computer, a portable information terminal, an electronic book reader, a mobile phone, a digital video camera, and a television set.

10. A driving method of a semiconductor device, the semiconductor device comprising:
    a memory element comprising a first transistor, a capacitor, and a second transistor;
    a first word line electrically connected to a gate terminal of the first transistor;
    a first bit line electrically connected to a source terminal of the first transistor;
    a source line electrically connected to a drain terminal of the first transistor;
    a second word line electrically connected to a gate terminal of the second transistor; and
    a second bit line electrically connected to a source terminal of the second transistor,
    wherein the gate terminal of the first transistor is electrically connected to a drain terminal of the second transistor;
    wherein the capacitor is electrically connected to the gate terminal of the first transistor and the first word line,
    wherein the first transistor comprises a semiconductor material, and
    wherein the second transistor comprises an oxide semiconductor layer,
    the driving method comprising the steps of:
    supplying a potential to the second word line to turn on the second transistor;
    supplying a potential to the first bit line step-by-step to supply an electrical charge to the gate terminal of the first transistor, while reading a current which flows into the first transistor; and
    stopping supplying the potential step-by-step to the first bit line when the current which flows into the first transistor reaches a given value, so that data writing is performed.

11. The driving method of a semiconductor device according to claim 10,
    wherein the memory element is arranged in a matrix of m rows (in the horizontal direction) by n columns (in the longitudinal direction) (m and n are natural numbers greater than or equal to 1), and
    wherein the data writing is performed per row sequentially from the first row.

12. The driving method of a semiconductor device according to claim 10,
    wherein the given value can be set to three or more values.

13. The driving method of a semiconductor device according to claim 10, wherein the semiconductor material is silicon.

14. The driving method of a semiconductor device according to claim 10, wherein the semiconductor material is a single crystalline semiconductor material.

15. The driving method of a semiconductor device according to claim 10, wherein the oxide semiconductor layer comprises In, Ga, and Zn.

16. The driving method of a semiconductor device according to claim 10, wherein the semiconductor device is one of a laptop personal computer, a portable information terminal, an electronic book reader, a mobile phone, a digital video camera, and a television set.

* * * * *